US010714161B2

(12) United States Patent
Kim et al.

(10) Patent No.: US 10,714,161 B2
(45) Date of Patent: Jul. 14, 2020

(54) SEMICONDUCTOR DEVICE

(71) Applicant: SK hynix Inc., Gyeonggi-do (KR)

(72) Inventors: Woongrae Kim, Gyeonggi-do (KR); Tae-Yong Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/191,076

(22) Filed: Nov. 14, 2018

(65) Prior Publication Data
US 2019/0267060 A1 Aug. 29, 2019

(30) Foreign Application Priority Data
Feb. 28, 2018 (KR) ........................ 10-2018-0024437

(51) Int. Cl.
*G11C 8/12* (2006.01)
*G11C 11/34* (2006.01)
(Continued)

(52) U.S. Cl.
CPC ................ *G11C 8/12* (2013.01); *G11C 7/106* (2013.01); *G11C 7/109* (2013.01); *G11C 7/1045* (2013.01); *G11C 7/1048* (2013.01); *G11C 7/1063* (2013.01); *G11C 7/1087* (2013.01); *G11C 7/22* (2013.01); *G11C 8/18* (2013.01); *G11C 11/34* (2013.01); *G11C 2207/10* (2013.01)

(58) Field of Classification Search
CPC ........... G11C 8/12; G11C 7/1045; G11C 8/18; G11C 7/1048; G11C 11/34; G11C 7/22; G11C 7/109; G11C 7/1063; G11C 7/1087; G11C 7/106; G11C 2207/10; G11C 7/1018

USPC .......................................................... 365/174
See application file for complete search history.

(56) References Cited

U.S. PATENT DOCUMENTS

| 2011/0242924 A1* | 10/2011 | Kim ........................ | G11C 8/12 365/230.03 |
| 2014/0372664 A1* | 12/2014 | Cho ........................ | G06F 12/02 711/102 |

(Continued)

FOREIGN PATENT DOCUMENTS

KR    100942970    2/2010

OTHER PUBLICATIONS

Office Action issued by the Taiwanese Patent Office dated Jun. 14, 2019.

*Primary Examiner* — Fernando Hidalgo
(74) *Attorney, Agent, or Firm* — IP & T Group LLP

(57) ABSTRACT

A semiconductor device includes: a memory region selection circuit for generating memory region select signals based on a memory region address signal and a mode identification signal, and activating one or more memory region select signals among memory region select signals during a first mode, or activating two or more memory region select signals among the memory region select signals during a second mode; a column selection circuit for generating column select signals based on a column address signal and the mode identification signal, and changing the column select signals during the first mode, or retaining the column select signals during the second mode; and memory regions of which one or more memory regions are accessed during the first mode or two or more memory regions are accessed during the second mode, based on the memory region select signals and the column select signals.

17 Claims, 14 Drawing Sheets

(51) Int. Cl.
*G11C 7/22* (2006.01)
*G11C 7/10* (2006.01)
*G11C 8/18* (2006.01)

(56) References Cited

U.S. PATENT DOCUMENTS

2016/0155490 A1* 6/2016 Shin .................... G11C 11/4085
365/203
2016/0342539 A1 11/2016 Bains

* cited by examiner

SEMICONDUCTOR DEVICE

CROSS-REFERENCE TO RELATED APPLICATION

This application claims priority under 35 U.S.C. § 119 to Korean Patent Application No. 10-2018-0024437 filed on Feb. 28, 2018, which is incorporated herein by reference in its entirety.

BACKGROUND

1. Field

Various exemplary embodiments of the present invention generally relate to a semiconductor design technology, and more particularly, to a semiconductor device.

2. Discussion of the Related Art

When a semiconductor device controls a data input/output method in different ways for various modes, the semiconductor device must have different control circuits for the respective modes. However, if the control circuits can be implemented into one circuit, it would be possible to guarantee optimized performance.

SUMMARY

Various embodiments are directed to a semiconductor device capable of flexibly controlling different data input/output methods for respective modes through one circuit.

In an embodiment, a semiconductor device may include: a memory region selection circuit suitable for generating a plurality of memory region select signals based on a memory region address signal and a mode identification signal, and activating one or more memory region select signals among the plurality of memory region select signals during a first mode, or activating two or more memory region select signals among the plurality of memory region select signals during a second mode; a column selection circuit suitable for generating a plurality of column select signals based on a column address signal and the mode identification signal, and changing the plurality of column select signals during the first mode, or retaining the plurality of column select signals during the second mode; and a plurality of memory regions of which one or more memory regions are accessed during the first mode or two or more memory regions are accessed during the second mode, based on the plurality of memory region select signals and the plurality of column select signals.

In an embodiment, a semiconductor device may include: a plurality of memory regions; a data path selection circuit suitable for generating a plurality of data path select signals for selectively coupling the plurality of memory regions to a data path, based on an operation mode signal, a mode identification signal and a plurality of flag signals, wherein the data path selection circuit activates a data path select signal corresponding to one memory region to be accessed among the plurality of data path select signals for a current second unit operation time of a current first unit operation time and activates the data path select signal for a next second unit operation time of a next first unit operation time, during a first mode, or sequentially activates data path select signals corresponding to two memory regions to be accessed among the plurality of data path select signals for the current first unit operation time during a second mode; a memory region selection circuit suitable for generating a plurality of memory region select signals corresponding to the plurality of memory regions based on the operation mode signal, the mode identification signal, memory region address signals and a latch source signal, wherein the memory region selection circuit activates a memory region select signal corresponding to the one memory region to be accessed among the plurality of memory region select signals for the current first unit operation time during the first mode, or activates memory region select signals corresponding to the two memory regions to be accessed among the plurality of memory region select signals at the same time for the current second unit operation time during the second mode; and a column selection circuit suitable for generating a plurality of column select signals based on the mode identification signal, column address signals, an inverted source signal and a plurality of latch control signals, wherein the column selection circuit generates and retains a column select signal group corresponding to the one memory region to be accessed among the plurality of column select signals for the current first unit operation time and changes and retains the column select signal group for the next first unit operation time, per input of the column address signals during the first mode, or generates and retains column select signal groups corresponding to the two memory regions to be accessed among the plurality of column select signals at the same time for the current first unit operation time per input of the column address signals during the second mode.

In an embodiment, a semiconductor device may include: a plurality of memory regions; a data path selection circuit suitable for generating a plurality of data path select signals for selectively coupling the plurality of memory regions to a data path, based on an operation mode signal, a burst length information signal and a plurality of flag signals, wherein the data path selection circuit activates a data path select signal corresponding to one memory region to be accessed among the plurality of data path select signals for a current second unit operation time of a current first unit operation time and activates the data path select signal for the next second unit operation time of the next first unit operation time, per input of column address signals during a first burst operation, or activates the data path select signal among the plurality of data path select signals for the current second unit operation time per input of the column address signals during a second burst operation; a memory region selection circuit suitable for generating a plurality of memory region select signals corresponding to the plurality of memory regions based on the operation mode signal, the mode identification signal, memory region address signals and a latch source signal, wherein the memory region selection circuit activates a memory region select signal corresponding to the one memory region to be accessed among the plurality of memory region select signals for the current first unit operation time per input of the column address signals during the first and second burst operations; and a column selection circuit suitable for generating a plurality of column select signals based on the mode identification signal, the column address signals, an inverted source signal and a plurality of latch control signals, wherein the column selection circuit generates and retains a column select signal group corresponding to the one memory region to be accessed among the plurality of column select signals for the current first unit operation time, and changes and retains the column select signal group for the next first unit operation time, per input of the column address signals during the first burst operation, or generates and retains the column select signal group for the current first unit operation time per input of the column address signals during the second burst operation.

DETAILED DESCRIPTION

Figure 1:
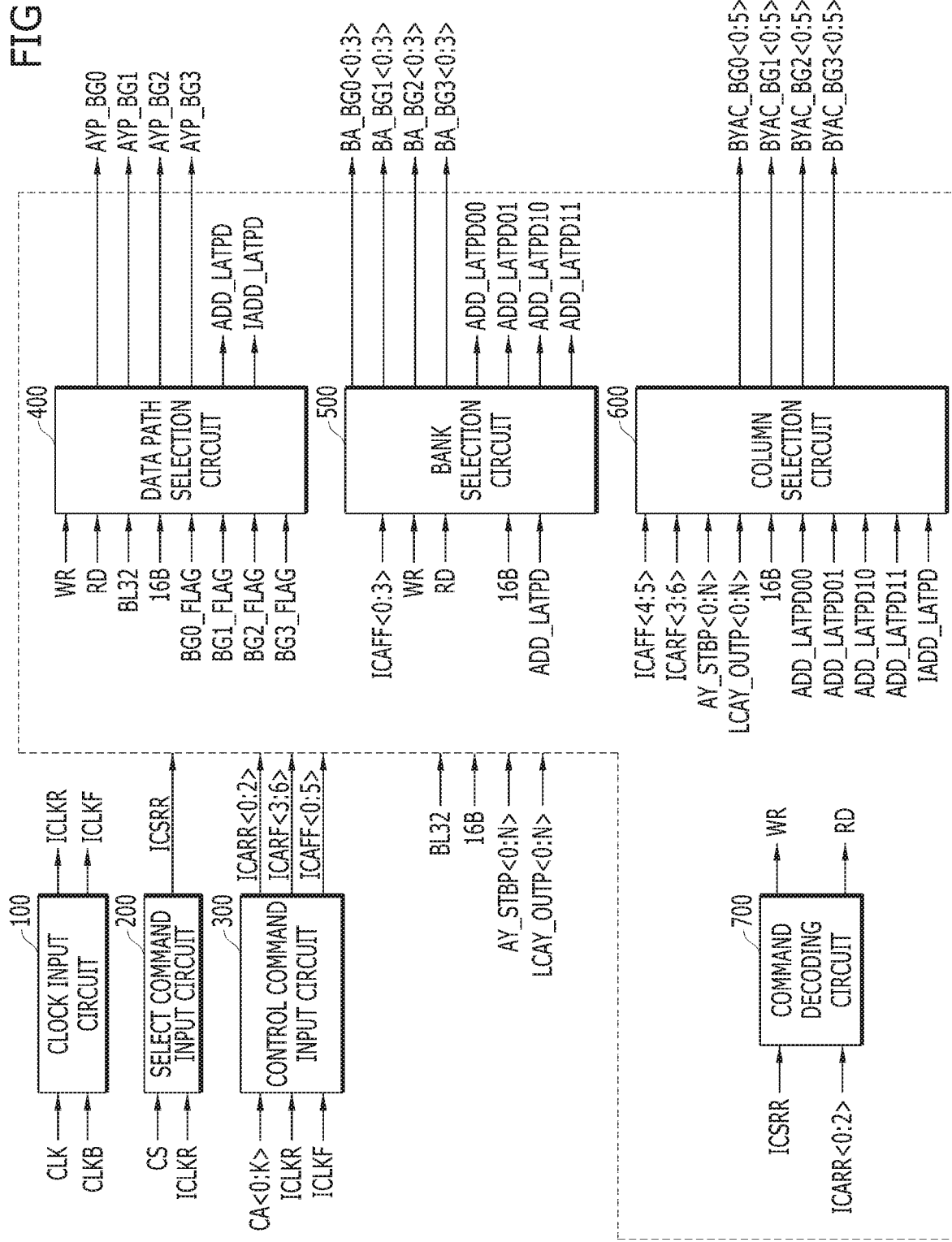
FIG. 1 is a block diagram of a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms may include the plural forms as well and vice versa, unless the context clearly indicates otherwise.

It is also noted, that in some instances, as would be apparent to those skilled in the relevant art, an element also referred to as a feature described in connection with one embodiment may be used singly or in combination with other elements of another embodiment, unless specifically indicated otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

Hereinafter, the various embodiments of the present invention will be described in detail with reference to the attached drawings.

FIG. 1 is a block diagram illustrating a semiconductor device in accordance with an embodiment.

Referring to FIG. 1, the semiconductor device may include a clock input circuit 100, a select command input circuit 200, a control command input circuit 300, a data path selection circuit 400, a bank selection circuit 500, a column selection circuit 600, and a command decoding circuit 700.

Based on first and second clock signals CLK and CLKB, the clock input circuit 100 may generate a first control clock signal ICLKR synchronized with a rising edge of the first clock signal CLK and a second control clock signal ICLKF synchronized with a falling edge of the first clock signal CLK.

The select command input circuit 200 may generate a select command signal ICSRR based on a first command signal CS and the first control clock signal ICLKR. The select command signal ICSRR may be synchronized with the first control clock signal ICLKR, i.e., a rising edge of the first clock signal CLK.

The control command input circuit 300 may generate first control command signals ICARR<0:2>, second control command signals ICARF<3:6> and third control command signals ICAFF<0:5>, based on second command signals CA<0:K>, the first control clock signal ICLKR and the second control clock signal ICLKF. For example, the control command input circuit 300 may generate the first control command signals ICARR<0:2> by synchronizing some signals CA<0:2> of the second command signals CA<0:A> with the first control clock signal ICLKR. The signals CA<0:2> are inputted at rising edges of the first clock signal CLK. The control command input circuit 300 may generate the second control command signals ICARF<3:6> by synchronizing some signals CA<3:6> of the second command signals CA<0:K> with the second clock signal ICLKF. The signals CA<3:6> are inputted at rising edges of the first clock signal CLK. The control command input circuit 300 may generate the third control command signals ICAFF<0:5> by synchronizing some signals CA<0:5> of the second command signals CA<0:K> with the second control clock signal ICLKF. The signals CA<0:5> are inputted at falling edges of the first clock signal CLK. In the following descriptions, some signals ICAFF<0:3> of the third control command signals ICAFF<0:5> will be referred to as bank address signals ICAFF<0:3>. Some signals ICAFF<4:5> of the third control command signals ICAFF<0:5> and the second control command signals ICARF<3:6> will be referred to as column address signals ICAFF<4:5> and ICARF<3:6>, respectively.

The data path selection circuit 400 may generate first to fourth data path select signals AYP_BG0, AYP_BG1, AYP_BG2 and AYP_BG3, a latch source signal ADD_LATPD and an inverted source signal IADD_LATPD, based on operation mode signals WR and RD, a mode identification signal 16B, a burst length information signal BL32 and first to fourth flag signals BG0_FLAG, BG1_FLAG, BG2_FLAG and BG3_FLAG.

The mode identification signal 16B may include signals for identifying first and second data input/output modes. For example, the mode identification signal 16B having a logic level "1" (or a high logic level) may indicate the first data input/output mode, and the mode identification signal 16B having a logic level "0" (or a low logic level) may indicate the second data input/output mode. The mode identification signal 16B may be preset in a mode register set.

The first data input/output mode may include a 4-bank-group mode. In the 4-bank-group mode, one bank among first to fourth banks BK0 to BK3 (not illustrated) included in each of first to fourth bank groups BG0 to BG3 (not illustrated), that is, a total of 16 banks may be accessed per input of the command signals CS and CA<0:K>. The bank may include a memory region which can be independently controlled. The 4-bank-group mode can support a burst-length-16 operation and a burst-length-32 operation. The burst-length-16 operation based on the 4-bank-group mode may read or write 16-bit data from or to the accessed one bank, and the burst-length-32 operation based on the 4-bank-group mode may read or write 32-bit data from or to the accessed one bank.

At this time, the 4-bank-group mode may require a time interval corresponding to a first unit operation time tCCD_L when the same bank group is consecutively accessed. In other words, in the 4-bank-group mode, the first bank group BG0 may be re-accessed at the first unit operation time tCCD_L after the first bank group BG0 was accessed. The first unit operation time tCCD_L may indicate a minimum time interval required for accessing the same bank group or a time interval in which the command signals CS and CA<0:K> corresponding to the same bank group may be consecutively inputted. The first unit operation time tCCD_L may correspond to a time internal required for gaplessly reading or writing the 32-bit data. On the other hand, when different bank groups are consecutively accessed, the 4-bank-group mode may require a time interval corresponding to a second unit operation time tCCD_S. In other words, in the 4-bank-group mode, any one of the second to fourth bank groups BG1 to BG3 may be accessed at the second unit operation time tCCD_S after the first bank group BG0 was accessed. The second unit operation time tCCD_S may indicate a minimum time interval required for accessing different bank groups or a time interval in which command signals CS and CA<0:K> corresponding to the different bank groups can be consecutively inputted. The second unit operation time tCCD_S may correspond to a time internal required for gaplessly reading or writing the 16-bit data.

The second data input/output mode may include an 8-bank mode. For example, in the 8-bank mode, two banks among the 16 banks may be sequentially accessed per input of the command signals CS and CA<0:K>. The 8-bank mode may support the burst-length-32 operation. The burst-length-32 operation based on the 8-bank mode may read or write 32-bit data from or to the accessed two banks.

At this time, the 8-bank mode may require a time interval corresponding to the first unit operation time tCCD_L when the next two banks are accessed. For example, in the 8-bank mode, any two banks of the 16 banks may be accessed at the first unit operation time tCCD_L after any two banks of the 16 banks were accessed.

The burst length information signal BL32 may indicate any one of the burst-length-16 operation and the burst-length-32 operation which are supported by the 4-bank-group mode. The burst length information signal BL32 may be preset in the mode register set.

The first to fourth data path select signals AYP_BG0, AYP_BG1, AYP_BG2 and AYP_BG3 may include a signal for selectively coupling one or more bank groups of the first to fourth bank groups to a data path (for example, a global input/output line). For example, the first data path select signal AYP_BG0 may include a signal for coupling the first bank group to the data path. The second data path select signal AYP_BG1 may include a signal for coupling the second bank group to the data path. The third data path select signal AYP_BG2 may include a signal for coupling the third bank group to the data path. The fourth data path select signal AYP_BG3 may include a signal for coupling the fourth bank group to the data path.

The operation mode signals RD and WR, the latch source signal ADD_LATPD and the inverted source signal IADD_LATPD will be described later.

The bank selection circuit (i.e., a memory region selection circuit) 500 may generate first to fourth bank select signal groups BA_BG0<0:3>, BA_BG1<0:3>, BA_BG2<0:3> and BA_BG3<0:3> and first to fourth latch control signals ADD_LATPD00, ADD_LATPD01, ADD_LATPD10 and ADD_LATPD11, which correspond to the first to fourth bank groups, based on the bank address signals ICAFF<0:3>, the operation mode signals WR and RD, the mode identification signal 16B and the latch source signal ADD_LATPD.

The column selection circuit 600 may generate a first column select signal group BYAC_BG0<0:5> corresponding to the first bank group, a second column select signal group BYAC_BG1<0:5> corresponding to the second bank group, a third column select signal group BYAC_BG2<0:5> corresponding to the third bank group, and a fourth column select signal group BYAC_BG3<0:5> corresponding to the fourth bank group. The column selection circuit 600 may generate the first to fourth column select signal groups BYAC_BG0<0:5> to BYAC_BG3<0:5> based on the column address signals ICAFF<4:5> and ICARF<3:6>, a plurality of strobe signals AY_STBP<0:N>, a plurality of output control signals LCAY_OUTP<0:N>, the mode identification signal 16B, the first to fourth latch control signals ADD_LATPD00, ADD_LATPD01, ADD_LATPD10 and ADD_LATPD11 and the inverted source signal IADD_LATPD. In particular, the column selection circuit 600 may change or retain the first to fourth column select signal groups BYAC_BG0<0:5>, BYAC_BG1<0:5>, BYAC_BG2<0:5> and BYAC_BG3<0:5> according to the 4-bank-group mode or the 8-bank mode. For example, the column selection circuit 600 may generate and retain any one signal group of the first to fourth column select signal groups BYAC_BG0<0:5>, BYAC_BG1<0:5>, BYAC_BG2<0:5> and BYAC_BG3<0:5> for a current first unit operation time tCCD_L, and change and retain the signal group for a next first unit operation time tCCD_L, per input of the column address signals ICAFF<4:5> and ICARF<3:6> during the burst-length-32 operation based on the 4-bank-group mode. Alternatively, the column selection circuit 600 may generate and retain any one signal group of the first to fourth column select signal groups BYAC_BG0<0:5>, BYAC_BG1<0:5>, BYAC_BG2<0:5> and BYAC_BG3<0:5> for the first unit operation time tCCD_L per input of the column address signals ICAFF<4:5> and ICARF<3:6> during the burst-length-16 operation based on the 4-bank-group mode. Alternatively, the column selection circuit 600 may generate and retain two signal groups among the first to fourth column select signal groups BYAC_BG0<0:5>, BYAC_BG1<0:5>, BYAC_BG2<0:5> and BYAC_BG3<0:5> at the same time for the first unit operation time tCCD_L during the burst-length-32 operation based on the 8-bank mode.

The first unit operation time tCCD_L may indicate a minimum time interval required for sequentially accessing banks belonging to the same bank group. The second unit operation time tCCD_S described later may indicate a minimum time interval required for sequentially accessing banks belonging to different bank groups. The first unit operation time tCCD_L may be longer than the second unit operation time tCCD_S. For example, the first unit operation time tCCD_L may be twice longer than the second unit operation time tCCD_S.

The command decoding circuit 700 may generate the operation mode signals WR and RD based on the select command signal ICSRR and the first control command signals ICARR<0:2>. The operation mode signals RD and WR may include a read command signal RD related to a read mode and a write command signal WR related to a write mode, respectively.

Figure 2:
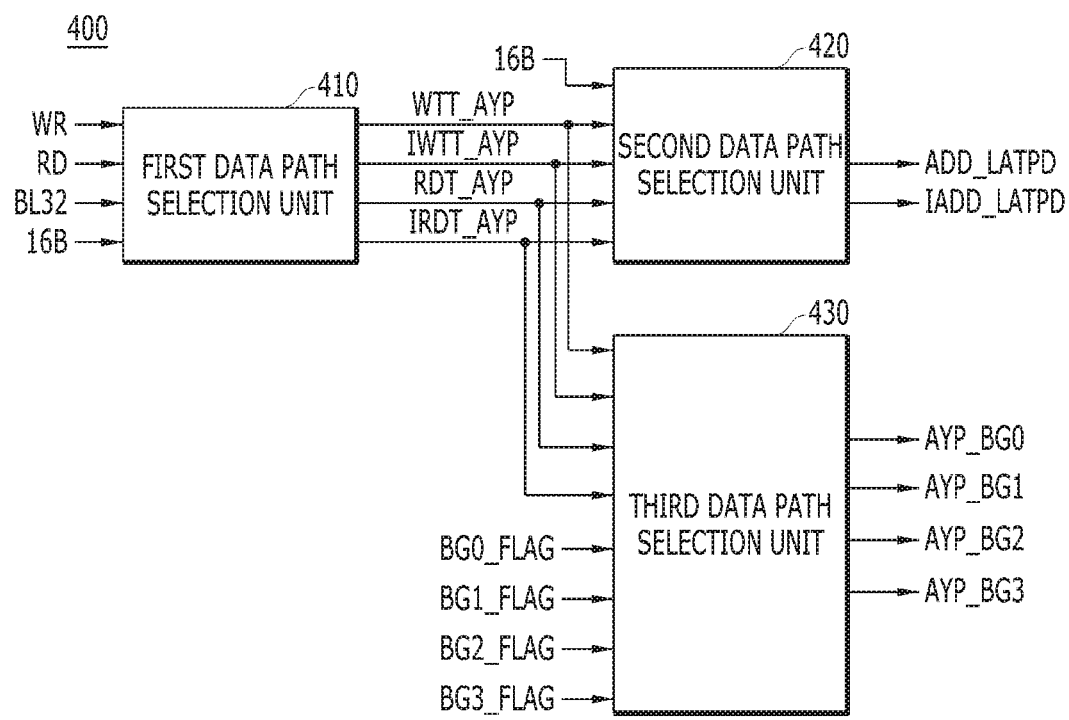
FIG. 2 is a block diagram of a data path selection circuit in accordance with an embodiment of the present invention.

FIG. 2 is a block diagram of a data path selection circuit in accordance with an embodiment, for example, the data path selection circuit 400 illustrated in FIG. 1.

Referring to FIG. 2, the data path selection circuit 400 may include first to third data path selection units 410 to 430.

The first data path selection unit 410 may generate first and second write control signals WTT_AYP and IWTT_AYP and first and second read control signals RDT_AYP and IRDT_AYP, based on the operation mode signals WR and RD, the mode identification signal 16B and the burst length information signal BL32. For example, the first data path selection unit 410 may sequentially generate the first and second write control signals WTT_AYP and IWTT_AYP during the write mode. At this time, the first data path selection unit 410 may activate the first write control signal WTT_AYP and then activate the second write control signal IWTT_AYP after the first unit operation time tCCD_L, during the burst-length-32 operation based on the 4-bank-group mode. On the other hand, the first data path selection unit 410 may activate the first write control signal WTT_AYP and then activate the second write control signal IWTT_AYP after the second unit operation time tCCD_S, during the burst-length-32 operation based on the 8-bank mode. Furthermore, the first data path selection unit 410 may activate the first write control signal WTT_AYP and continuously deactivate the second write control signal IWTT_AYP during the burst-length-16 operation based on the 4-bank-group mode.

The second data path selection unit 420 may generate the latch source signal ADD_LATPD and the inverted source signal IADD_LATPD based on the mode identification signal 16B, the first and second write control signals WTT_AYP and IWTT_AYP, and the first and second read control signals RDT_AYP and IRDT_AYP. For example, the second data path selection unit 420 may activate the latch source signal ADD_LATPD corresponding to the first write control signal WTT_AYP and then activate the inverted source signal IADD_LATPD corresponding to the second write control signal IWTT_AYP after the first unit operation time tCCD_L, during the burst-length-32 operation based on the 4-bank-group mode. On the other hand, the second data path selection unit 420 may activate the latch source signal ADD_LATPD corresponding to the first write control signal WTT_AYP and continuously deactivate the inverted source signal IADD_LATPD regardless of the second write control signal IWTT_AYP, during the burst-length-32 operation based on the 8-bank mode. Furthermore, the second data path selection unit 420 may activate the latch source signal ADD_LATPD corresponding to the first write control signal WTT_AYP and continuously deactivate the inverted source signal IADD_LATPD in response to the deactivated second write control signal IWTT_AYP, during the burst-length-16 operation based on the 4-bank-group mode.

The third data path selection unit 430 may generate the first to fourth data path select signals AYP_BG0, AYP_BG1, AYP_BG2 and AYP_BG3, based on the first and second write control signals WTT_AYP and IWTT_AYP, the first and second read control signals RDT_AYP and IRDT_AYP, and the first to fourth flag signals BG0_FLAG, BG1_FLAG, BG2_FLAG and BG3_FLAG.

Figure 3:
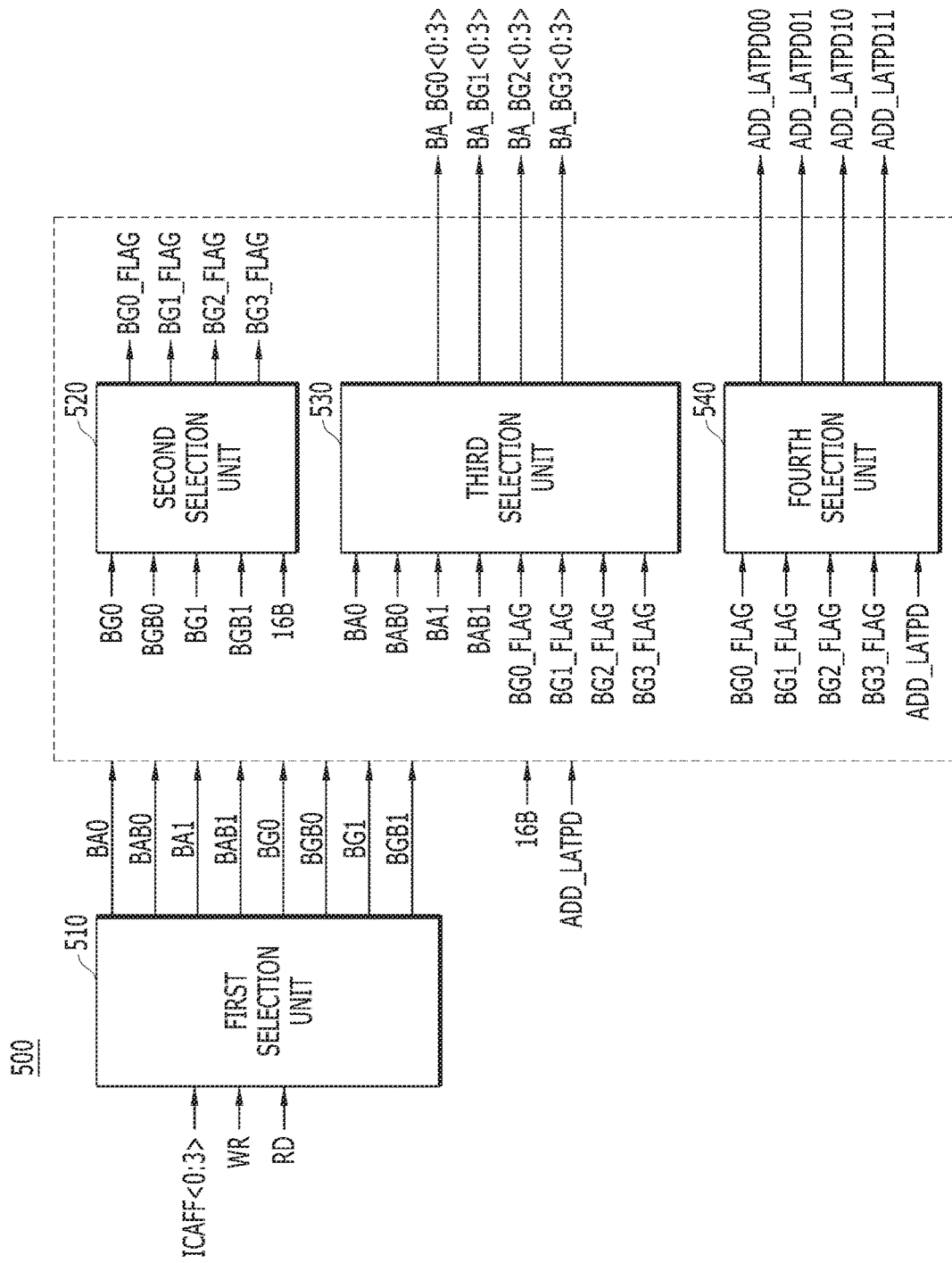
FIG. 3 is a block diagram of a bank selection circuit in accordance with an embodiment of the present invention.

FIG. 3 is a block diagram of a bank selection circuit in accordance with an embodiment, for example, the bank selection circuit 500 illustrated in FIG. 1.

Referring to FIG. 3, the bank selection circuit 500 may include first to fourth selection units 510 to 540.

The first selection unit 510 may generate first to eighth select code signals BA0, BAB0, BA1, BAB1, BG0, BGB0, BG1 and BGB1 based on the operation mode signals WR and RD and the bank address signals ICAFF<0:3>.

The second selection unit 520 may generate the first to fourth flag signals BG0_FLAG, BG1_FLAG, BG2_FLAG and BG3_FLAG based on the fifth to eighth select code signals BG0, BGB0, BG1 and BGB1 and the mode identification signal 16B.

The third selection unit 530 may generate the first to fourth bank select signal groups BA_BG0<0:3>, BA_BG1<0:3>, BA_BG2<0:3> and BA_BG3<0:3> based on the first to fourth select code signals BA0, BAB0, BA1 and BAB1 and the first to fourth flag signals BG0_FLAG, BG1_FLAG, BG2_FLAG and BG3_FLAG.

The fourth selection unit 540 may generate the first to fourth latch control signals ADD_LATPD00, ADD_LATPD01, ADD_LATPD10 and ADD_LATPD11 based on the first to fourth flag signals BG0_FLAG, BG1_FLAG, BG2_FLAG and BG3_FLAG and the latch source signal ADD_LATPD.

Figure 4:
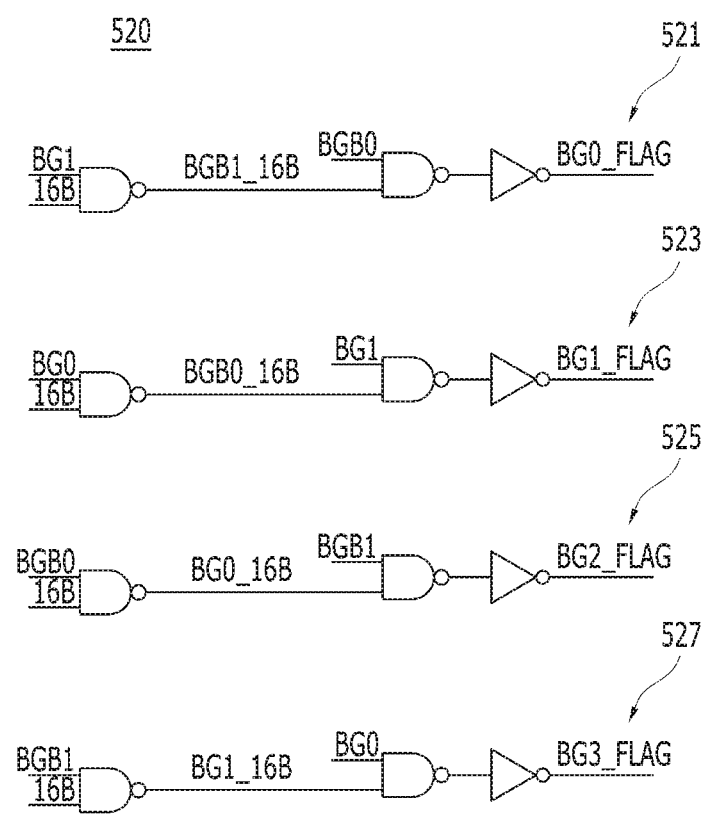
FIG. 4 is a block diagram of a second selection unit in accordance with an embodiment of the present invention.

FIG. 4 is a circuit diagram of a second selection unit in accordance with an embodiment, for example, the second selection unit 520 illustrated in FIG. 3.

Referring to FIG. 4, the second selection unit 520 may include first to fourth decoders 521, 523, 525 and 527.

The first decoder 521 may generate the first flag signal BG0_FLAG based on the sixth and seventh select code signals BGB0 and BG1 and the mode identification signal 16B. For example, the first decoder 521 may determine the logic level of the first flag signal BG0_FLAG according to the logic level of the sixth select code signal BGB0 and the logic level of the seventh select code signal BG1 during the 4-bank-group mode. Furthermore, the first decoder 521 may determine the logic level of the first flag signal BG0_FLAG according to the logic level of the sixth select code signal BGB0 regardless of the logic level of the seventh select code signal BG1, during the 8-bank mode.

The second decoder 523 may generate the second flag signal BG1_FLAG based on the fifth and seventh select code signals BG0 and BG1 and the mode identification signal 16B. For example, the second decoder 523 may determine the logic level of the second flag signal BG1_FLAG according to the logic level of the fifth select code signal BG0 and the logic level of the seventh select code signal BG1 during the 4-bank-group mode. Furthermore, the second decoder 523 may determine the logic level of the second flag signal BG1_FLAG according to the logic level of the seventh select code signal BG1 regardless of the logic level of the fifth select code signal BG0, during the 8-bank mode.

The third decoder 525 may generate the third flag signal BG2_FLAG based on the sixth and eighth select code signals BGB0 and BGB1 and the mode identification signal 16B. For example, the third decoder 525 may determine the logic level of the third flag signal BG2_FLAG according to the logic level of the sixth select code signal BGB0 and the logic level of the eighth select code signal BGB1 during the 4-bank-group mode. Furthermore, the third decoder 525 may determine the logic level of the third flag signal BG2_FLAG according to the logic level of the eighth select code signal BGB1 regardless of the logic level of the sixth select code signal BGB0, during the 8-bank mode.

The fourth decoder 527 may generate the fourth flag signal BG3_FLAG based on the fifth and eighth select code signals BG0 and BGB1 and the mode identification signal 16B. For example, the fourth decoder 527 may determine the logic level of the fourth flag signal BG3_FLAG according to the logic level of the fifth select code signal BG0 and the logic level of the eighth select code signal BGB1 during the 4-bank-group mode. Furthermore, the fourth decoder 527 may determine the logic level of the fourth flag signal BG3_FLAG according to the logic level of the fifth select code signal BG0 regardless of the logic level of the eighth select code signal BGB1, during the 8-bank mode.

Figure 5:
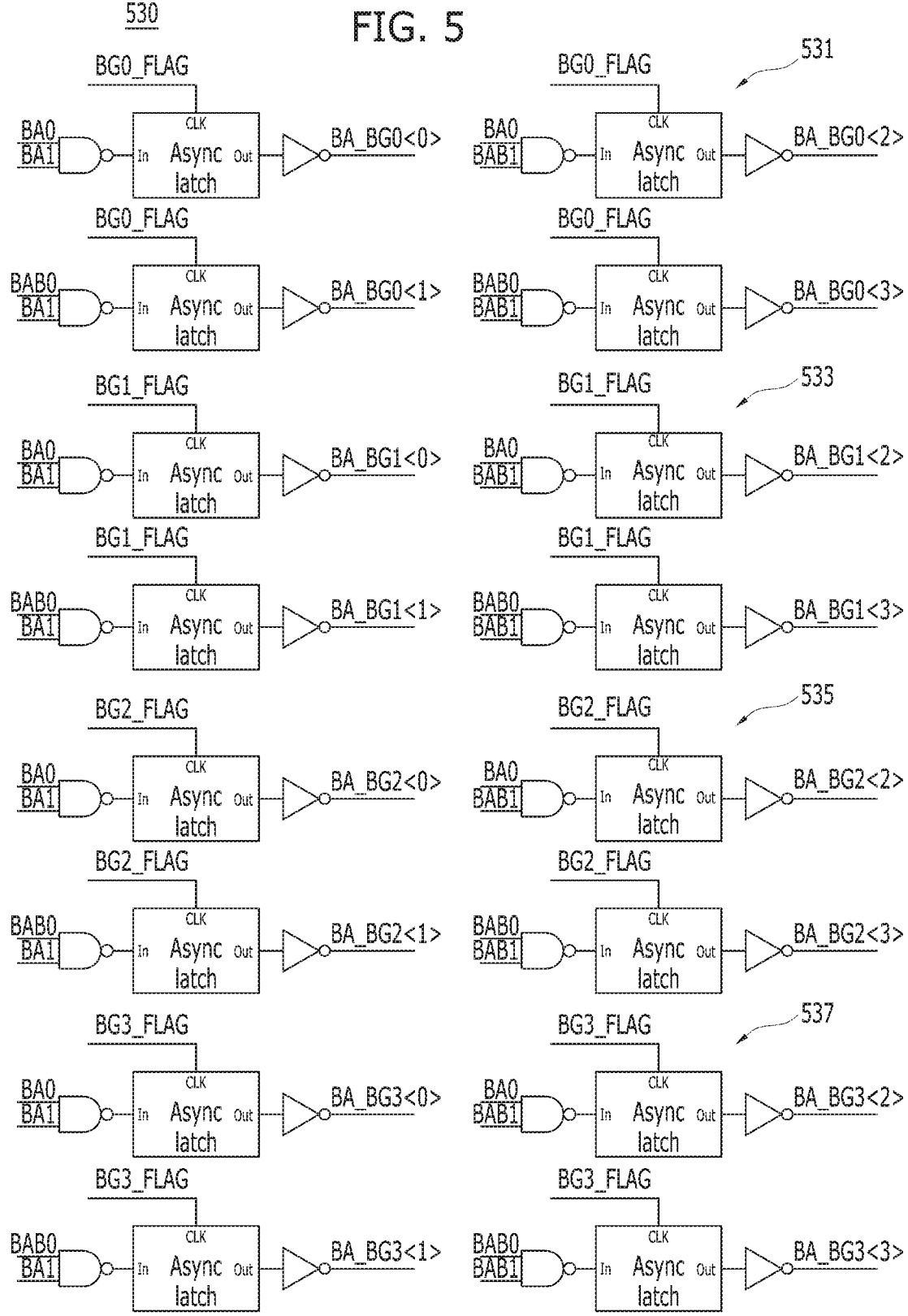
FIG. 5 is a block diagram of a third selection unit in accordance with an embodiment of the present invention.

FIG. 5 is a circuit diagram of a third selection unit in accordance with an embodiment, for example, the third selection unit 530 illustrated in FIG. 3.

Referring to FIG. 5, the third selection unit 530 may include first to fourth latch sets 531, 533, 535 and 537.

The first latch set 531 may generate the first bank select signal group BA_BG0<0:3> based on the first to fourth select code signals BA0, BAB0, BA1 and BAB1 and the first flag signal BG0_FLAG.

For example, the first latch set 531 may include first to fourth NAND gates, first to fourth async latches and first to fourth inverters.

The first NAND gate may generate a first output signal by performing a NAND operation on the first and third select code signals BA0 and BA1. The first async latch may latch the first output signal as a first latch signal based on the first flag signal BG0_FLAG. The first inverter may generate a bank select signal BA_BG0<0> included in the first bank select signal group BA_BG0<0:3> by inverting the first latch signal latched in the first async latch.

The second NAND gate may generate a second output signal by performing a NAND operation on the second and third select code signals BAB0 and BA1. The second async latch may latch the second output signal as a second latch signal based on the first flag signal BG0_FLAG. The second inverter may generate a bank select signal BA_BG0<1> included in the first bank select signal group BA_BG0<0:3> by inverting the second latch signal latched in the second async latch.

The third NAND gate may generate a third output signal by performing a NAND operation on the first and fourth select code signals BA0 and BAB1. The third async latch may latch the third output signal as a third latch signal based on the first flag signal BG0_FLAG. The third inverter may generate a bank select signal BA_BG0<2> included in the first bank select signal group BA_BG0<0:3> by inverting the third latch signal latched in the third async latch.

The fourth NAND gate may generate a fourth output signal by performing a NAND operation on the second and fourth select code signals BAB0 and BAB1. The fourth async latch may latch the fourth output signal as a fourth latch signal based on the first flag signal BG0_FLAG. The fourth inverter may generate a bank select signal BA_BG0<3> included in the first bank select signal group BA_BG0<0:3> by inverting the fourth latch signal latched in the fourth async latch.

The second latch set 533 may generate the second bank select signal group BA_BG1<0:3> based on the first to fourth select code signals BA0, BAB0, BA1 and BAB1 and the second flag signal BG1_FLAG.

For example, the second latch set 533 may include first to fourth NAND gates, first to fourth async latches, and first to fourth inverters, similar to the first latch set 531. Therefore, the detailed descriptions thereof are omitted herein.

The third latch set 535 may generate the third bank select signal group BA_BG2<0:3> based on the first to fourth select code signals BA0, BAB0, BA1 and BAB1 and the third flag signal BG2_FLAG.

For example, the third latch set 535 may include first to fourth NAND gates, first to fourth async latches, and first to fourth inverters, similar to the first latch set 531. Therefore, the detailed descriptions thereof are omitted herein.

The fourth latch set 537 may generate the fourth bank select signal group BA_BG3<0:3> based on the first to fourth select code signals BA0, BAB0, BA1 and BAB1 and the fourth flag signal BG3_FLAG.

For example, the fourth latch set 537 may include first to fourth NAND gates, first to fourth async latches, and first to fourth inverters, similar to the first latch set 531. Therefore, the detailed descriptions thereof are omitted herein.

Figure 6:
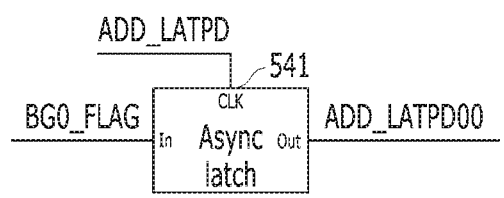
FIG. 6 is a block diagram of a fourth selection unit in accordance with an embodiment of the present invention.
Figure 6:
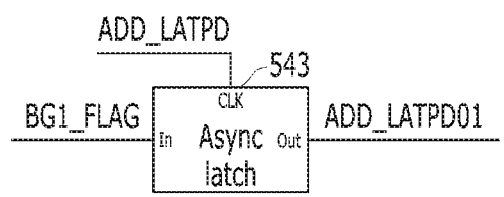
Figure 6:
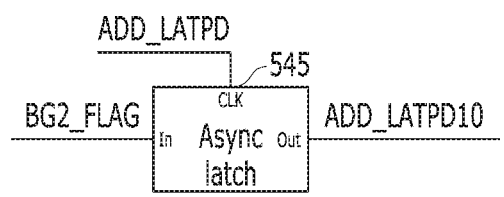
Figure 6:
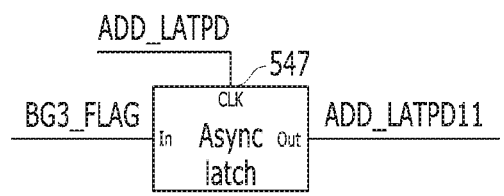

FIG. 6 is a block diagram of a fourth selection unit in accordance with an embodiment, for example, the fourth selection unit 540 illustrated in FIG. 3.

Referring to FIG. 6, the fourth selection unit 540 may include first to fourth async latches 541, 543, 545 and 547.

The first async latch 541 may latch the first flag signal BG0_FLAG as the first latch control signal ADD_LATPD00 based on the latch source signal ADD_LATPD.

The second async latch 543 may latch the second flag signal BG1_FLAG as the second latch control signal ADD_LATPD01 based on the latch source signal ADD_LATPD.

The third async latch 545 may latch the third flag signal BG2_FLAG as the third latch control signal ADD_LATPD10 based on the latch source signal ADD_LATPD.

The fourth async latch 547 may latch the fourth flag signal BG3_FLAG as the fourth latch control signal ADD_LATPD11 based on the latch source signal ADD_LATPD.

Figure 7:
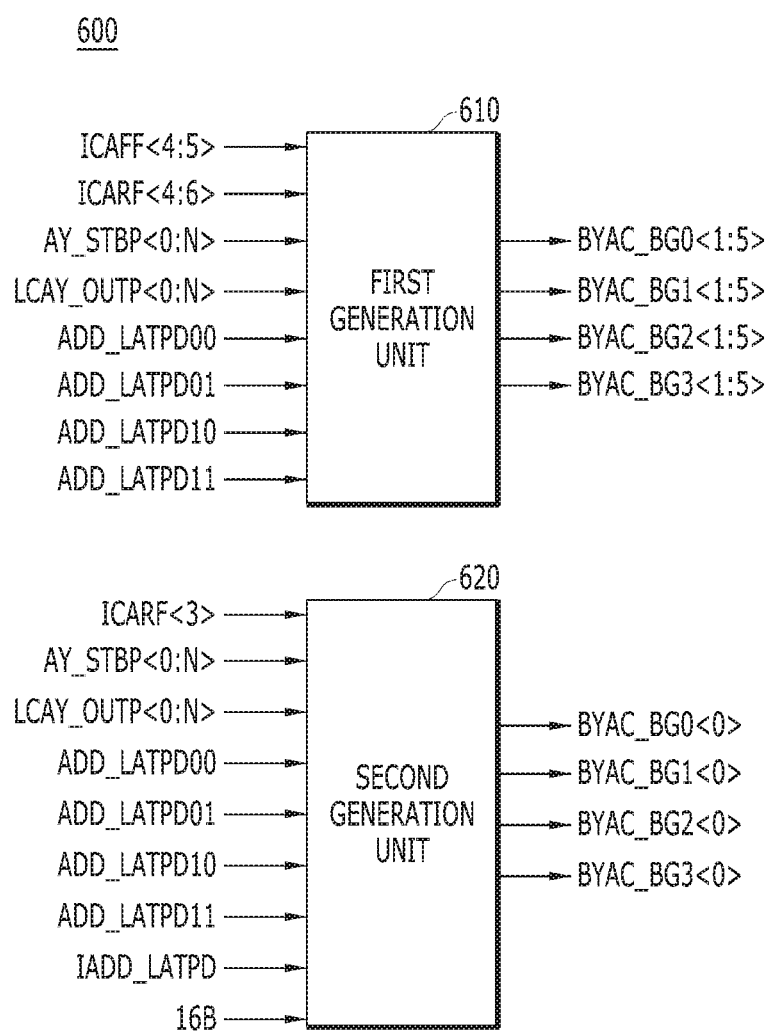
FIG. 7 is a block diagram of a column selection circuit in accordance with an embodiment of the present invention.

FIG. 7 is a block diagram of a column selection circuit in accordance with an embodiment, for example, the column selection circuit 600 illustrated in FIG. 1.

Referring to FIG. 7, the column selection circuit 600 may include first and second generation units 610 and 620.

The first generation unit 610 may generate column select signals BYAC_BG0<1:5>, column select signals BYAC_BG1<1:5>, column select signals BYAC_BG2<1:5> and column select signals BYAC_BG3<1:5> among the first to fourth column select signal groups BYAC_BG0<0:5>, BYAC_BG1<0:5>, BYAC_BG2<0:5> and BYAC_BG3<0:5>, based on some column address signals ICAFF<4:5> and ICARF<4:6> of the column address signals ICAFF<4:5> and ICARF<3:6>, the plurality of strobe signals AY_STBP<0:N>, the plurality of output control signals LCAY_OUTP<0:N> and the first to fourth latch control signals ADD_LATPD00, ADD_LATPD01, ADD_LATPD10 and ADD_LATPD11. For example, the first generation unit 610 may generate column select signals BYAC_BG#<1:5> corresponding to one bank group to be accessed, among the column select signals BYAC_BG0<1:5>, the column select signals BYAC_BG1<1:5>, the column select signals BYAC_BG2<1:5> and the column select signals BYAC_BG3<1:5>, and retain the generated column select signals BYAC_BG#<1:5> for the first unit operation time tCCD_L, during the 4-bank-group mode. Alternatively, the first generation unit 610 may generate column select signals BYAC_BG#1<1:5> and BYAC_BG#2<1:5> corresponding to two bank groups to be accessed, among the column select signals BYAC_BG0<1:5>, the column select signals BYAC_BG1<1:5>, the column select signals BYAC_BG2<1:5> and the column select signals BYAC_BG3<1:5>, and retain the generated column select signals BYAC_BG#1<1:5> and BYAC_BG#2<1:5> for the first unit operation time tCCD_L, during the 8-bank mode.

The second generation unit 620 may generate the column select signals BYAC_BG0<0>, BYAC_BG1<0>, BYAC_BG2<0> and BYAC_BG3<0> among the first to fourth column select signal groups BYAC_BG0<0:5>, BYAC_BG1<0:5>, BYAC_BG2<0:5> and BYAC_BG3<0:5>, based on the other column address signal ICARF<4> of the column address signals ICAFF<4:5> and ICARF<3:6>, the mode identification signal 16B, the plurality of strobe signals AY_STBP<0:N>, the plurality of output control signals LCAY_OUTP<0:N>, the first to fourth latch control signals ADD_LATPD00, ADD_LATPD01, ADD_LATPD10 and ADD_LATPD11 and the inverted source signal IADD_LATPD. For example, the second generation unit 620 may generate a column select signal BYAC_BG#<0> corresponding to one bank group to be accessed, among the column select signals BYAC_BG0<0>, BYAC_BG1<0>, BYAC_BG2<0> and BYAC_BG3<0>, and change the generated column select signal BYAC_BG#<0> one or more times for the first unit operation time tCCD_L, during the 4-bank-group mode. Alternatively, the second generation unit 620 may generate column select signals BYAC_BG#1<0> and BYAC_BG#2<0> corresponding to two bank groups to be accessed, among the column select signals BYAC_BG0<0>, BYAC_BG1<0>, BYAC_BG2<0> and BYAC_BG3<0>, and retain the generated column select signals BYAC_BG#1<0> and BYAC_BG#2<0> for the first unit operation time tCCD_L, during the 8-bank mode.

Figure 8:
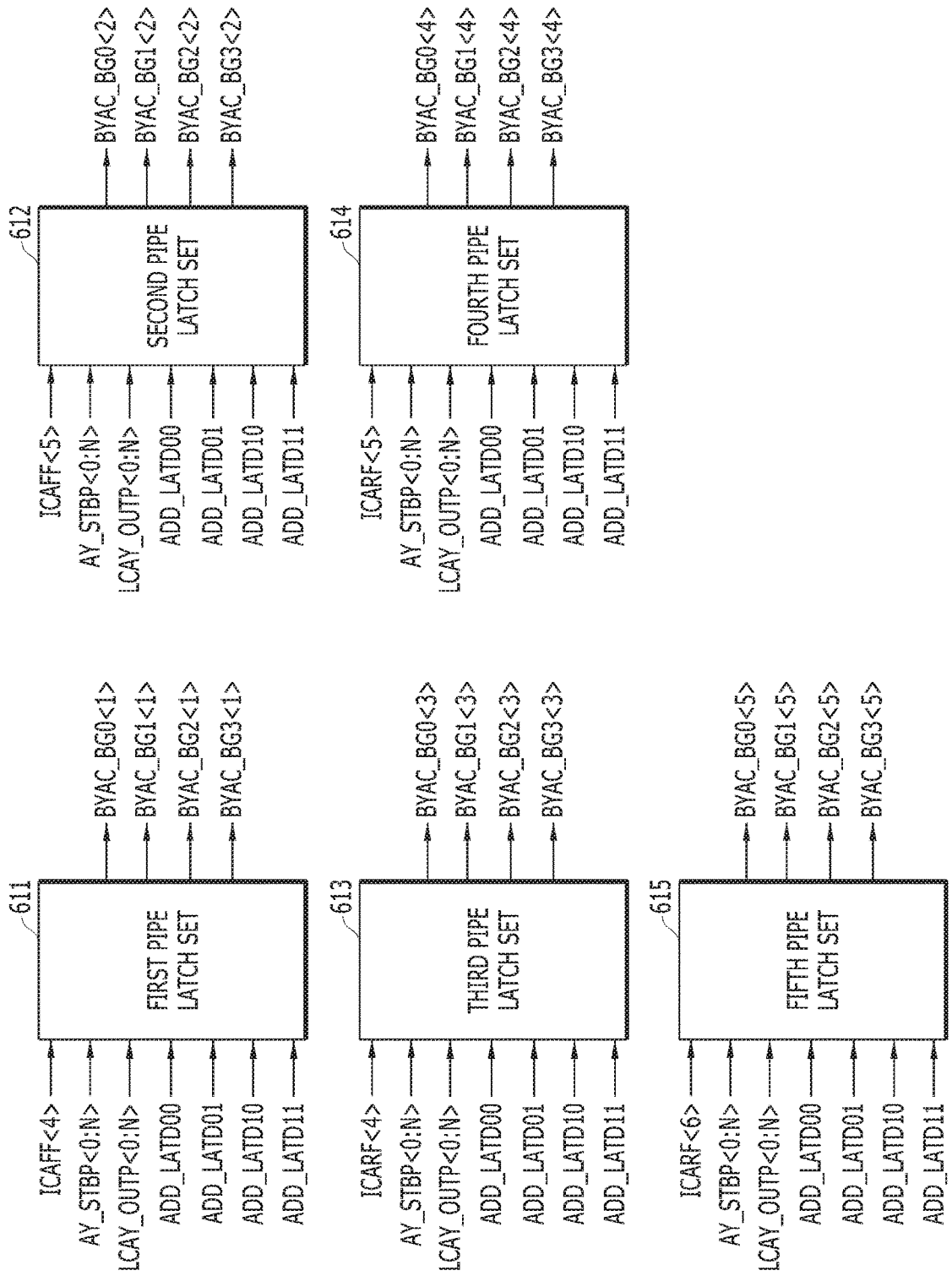
FIG. 8 is a block diagram of a first generation unit in accordance with an embodiment of the present invention.

FIG. 8 is a block diagram of a first generation unit in accordance with an embodiment, for example, the first generation unit 610 illustrated in FIG. 7.

Referring to FIG. 8, the first generation unit 610 may include first to fifth pipe latch sets 611 to 615.

The first pipe latch set 611 may generate the column select signals BYAC_BG0<1>, BYAC_BG1<1>, BYAC_BG2<1> and BYAC_BG3<1> based on the first column address signal ICAFF<4> of the some column address signals ICAFF<4:5> and ICARF<3:6>, the plurality of strobe signals AY_STBP<0:N>, the plurality of output control signals LCAY_OUTP<0:N> and the first to fourth latch control signals ADD_LATPD00, ADD_LATPD01, ADD_LATPD10 and ADD_LATPD11.

The second pipe latch set 612 may generate the column select signals BYAC_BG0<2>, BYAC_BG1<2>, BYAC_BG2<2> and BYAC_BG3<2> based on the second column address signal ICAFF<5> of the some column address signals ICAFF<4:5> and ICARF<3:6>, the plurality of strobe signals AY_STBP<0:N>, the plurality of output control signals LCAY_OUTP<0:N> and the first to fourth latch control signals ADD_LATPD00, ADD_LATPD01, ADD_LATPD10 and ADD_LATPD11.

The third pipe latch set 613 may generate the column select signals BYAC_BG0<3>, BYAC_BG1<3>, BYAC_BG2<3> and BYAC_BG3<3> based on the third column address signal ICARF<4> of the some column address signals ICAFF<4:5> and ICARF<3:6>, the plurality of strobe signals AY_STBP<0:N>, the plurality of output control signals LCAY_OUTP<0:N> and the first to fourth latch control signals ADD_LATPD00, ADD_LATPD01, ADD_LATPD10 and ADD_LATPD11.

The fourth pipe latch set 614 may generate the column select signals BYAC_BG0<4>, BYAC_BG1<4>, BYAC_BG2<4> and BYAC_BG3<4> based on the fourth column address signal ICARF<5> of the some column address signals ICAFF<4:5> and ICARF<3:6>, the plurality of strobe signals AY_STBP<0:N>, the plurality of output control signals LCAY_OUTP<0:N> and the first to fourth latch control signals ADD_LATPD00, ADD_LATPD01, ADD_LATPD10 and ADD_LATPD11.

The fifth pipe latch set 615 may generate the column select signals BYAC_BG0<5>, BYAC_BG1<5>, BYAC_BG2<5> and BYAC_BG3<5> based on the fifth column address signal ICARF<6> of the some column address signals ICAFF<4:5> and ICARF<3:6>, the plurality of strobe signals AY_STBP<0:N>, the plurality of output control signals LCAY_OUTP<0:N> and the first to fourth latch control signals ADD_LATPD00, ADD_LATPD01, ADD_LATPD10 and ADD_LATPD11.

Figure 9:
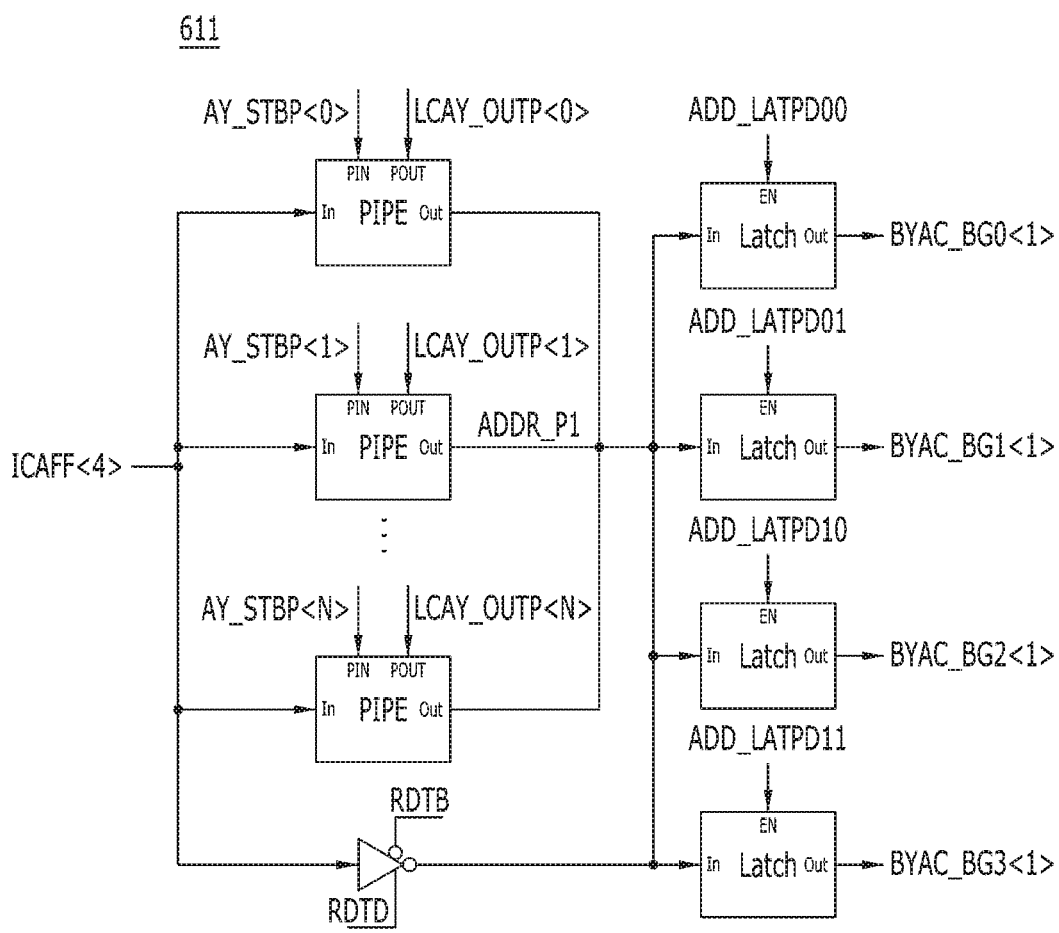
FIG. 9 is a block diagram of a first pipe latch set in accordance with an embodiment of the present invention.

FIG. 9 is a block diagram of a first pipe latch set in accordance with an embodiment, for example, the first pipe latch set 611 illustrated in FIG. 8.

Referring to FIG. 9, the first pipe latch set 611 may include a plurality of pipe latches, first to fourth async latches and a tri-state inverter.

The plurality of pipe latches may sequentially latch the first column address signal ICAFF<4> based on the plurality of strobe signals AY_STBP<0:N>, and sequentially output the latched first column address signal as an output address signal ADDR_P1 based on the plurality of output control signals LCAY_OUTP<0:N>.

The plurality of strobe signals AY_STBP<0:N> and the plurality of output control signals LCAY_OUTP<0:N> may be sequentially generated according to the number of times that the write command signal WR or a mask write command MWR is inputted. For example, when the first write command signal WR is inputted, the first strobe signal AY_STBP<0> may be activated, and the first output control signal LCAY_OUTP<0> may be activated after a predetermined time. The predetermined time may be set to 'write latency (WL)+α'. Furthermore, when the (N+1)th write command signal WR is inputted, the (N+1)th strobe signal AY_STBP<N> may be activated, and the (N+1)th output control signal LCAY_OUTP<N> may be activated after the predetermined time.

The first to fourth async latches may latch the output address signal ADDR_P1 to output the column select signals BYAC_BG0<1>, BYAC_BG1<1>, BYAC_BG2<1> and BYAC_BG3<1> based on the first to fourth latch control signals ADD_LATPD00, ADD_LATPD01, ADD_LATPD10 and ADD_LATPD11, respectively.

The tri-state inverter may be enabled during the read mode. The tri-state inverter may output the first column address signal ICAFF<4> as the output address signal ADDR_P1 based on read control signals RDTD and RDTB derived from the read command signal RD.

Since the second to fifth pipe latch sets 612 to 615 of FIG. 8 are configured in a similar manner to the first pipe latch set 611, the detailed descriptions thereof are omitted herein.

Figure 10:
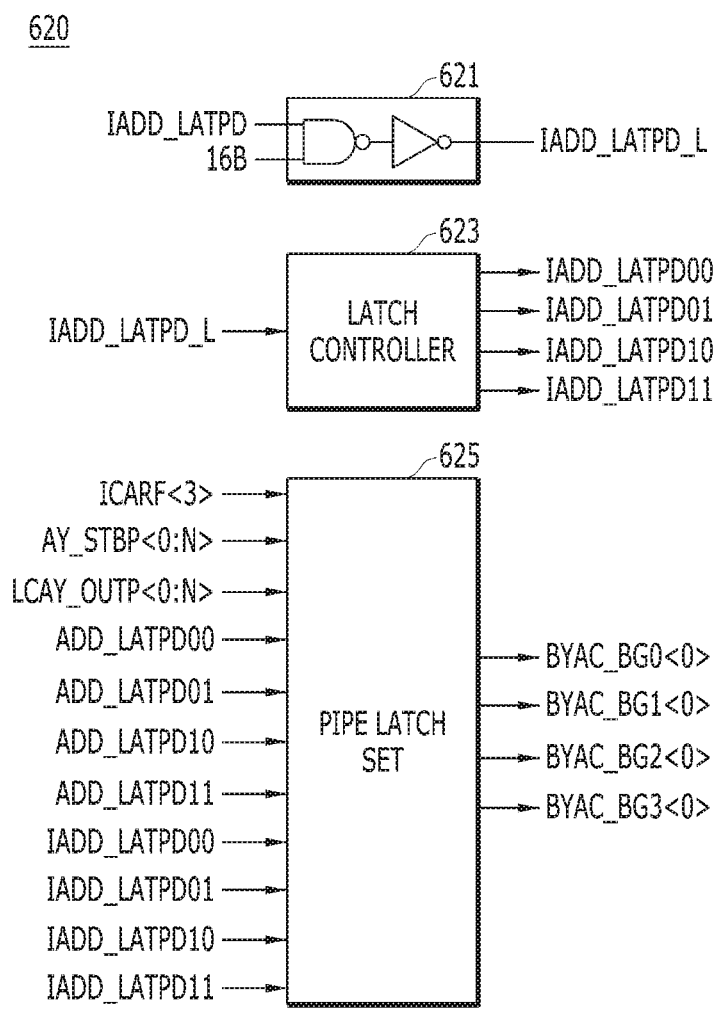
FIG. 10 is a block diagram of a second generation unit in accordance with an embodiment of the present invention.

FIG. 10 is a block diagram of a second generation unit in accordance with an embodiment, for example, the second generation unit 620 illustrated in FIG. 7.

Referring to FIG. 10, the second generation unit 620 may include a generator 621, a latch controller 623 and a pipe latch set 625.

The generator 621 may generate an inverted pre-control signal IADD_LATPD_L based on the inverted source signal IADD_LATPD and the mode identification signal 16B. For example, the generator 621 may include a NAND gate and an inverter. The NAND gate may generate an output signal by performing a NAND operation on the inverted source signal IADD_LATPD and the mode identification signal 16B. The inverter may generate the inverted pre-control signal IADD_LATPD_L by inverting the output signal of the NAND gate.

The latch controller 623 may generate first to fourth inverted control signals IADD_LATPD00, IADD_LATPD01, IADD_LATPD10 and IADD_LATPD11 corresponding to the first to fourth bank groups, based on the inverted pre-control signal IADD_LATPD_L.

The pipe latch set 625 may generate the column select signals BYAC_BG0<0>, BYAC_BG1<0>, BYAC_BG2<0> and BYAC_BG3<0> based on the sixth column address signal ICARF<3> of the some column address signals ICAFF<4:5> and ICARF<3:6>, the plurality of strobe signals AY_STBP<0:N>, the plurality of output control signals LCAY_OUTP<0:N>, the first to fourth latch control signals ADD_LATPD00, ADD_LATPD01, ADD_LATPD10 and ADD_LATPD11, and the first to fourth inverted control signals IADD_LATPD00, IADD_LATPD01, IADD_LATPD10 and IADD_LATPD11.

Figure 11:
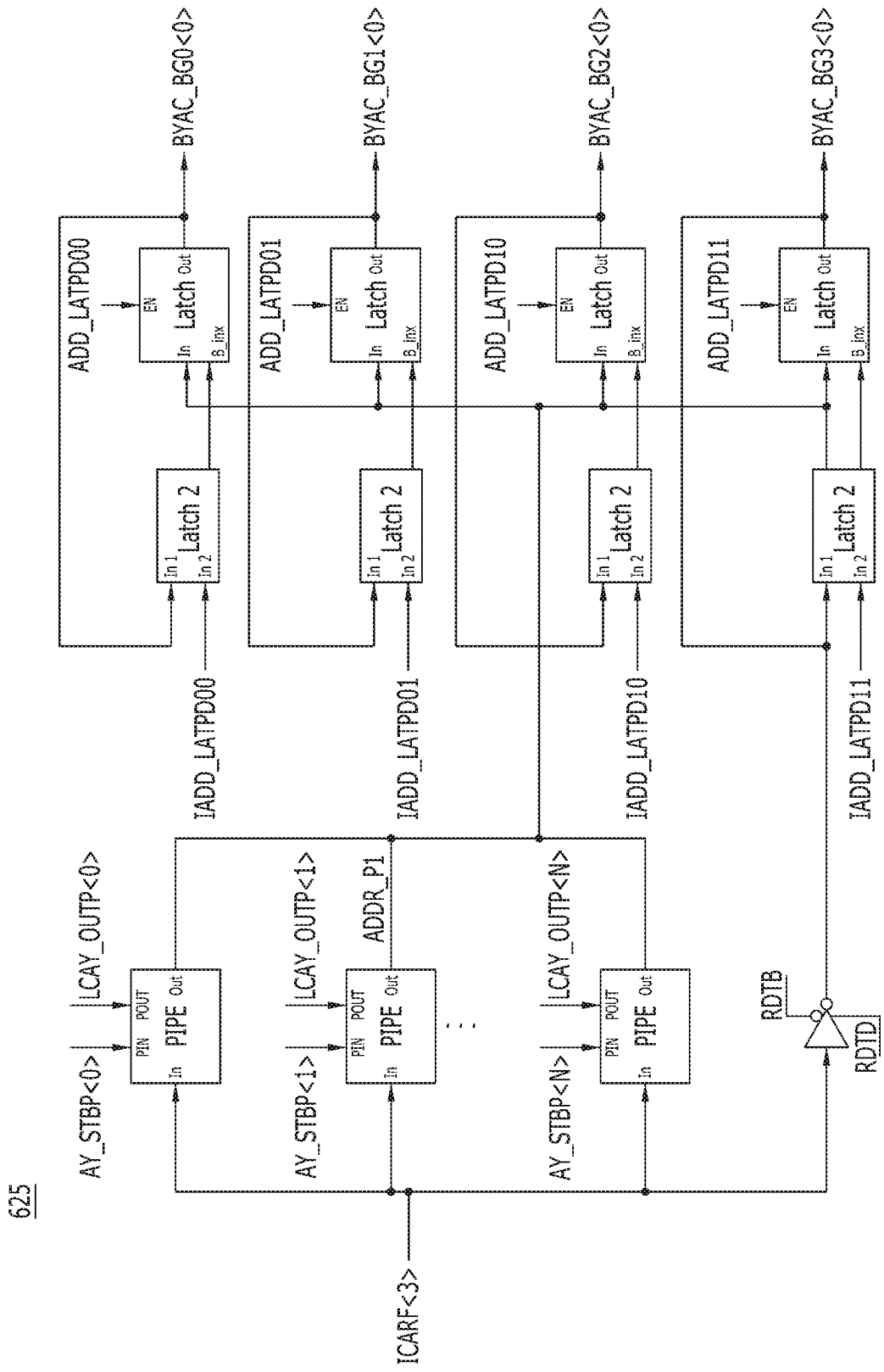
FIG. 11 is a block diagram of a pipe latch set in accordance with an embodiment of the present invention.

FIG. 11 is a block diagram of in accordance with an embodiment, for example, the pipe latch set 625 illustrated in FIG. 10.

Referring to FIG. 11, the pipe latch set 625 may include a plurality of pipe latches and first to eighth async latches.

The plurality of pipe latches may sequentially latch the sixth column address signal ICARF<3> based on the plurality of strobe signals AY_STBP<0:N>, and sequentially output the latched sixth column address signal as the output address signal ADDR_P1 based on the plurality of output control signals LCAY_OUTP<0:N>.

The first to fourth async latches may latch the column select signals BYAC_BG0<0>, BYAC_BG1<0>, BYAC_BG2<0> and BYAC_BG3<0> as first to fourth control signals, based on the first to fourth inverted control signals IADD_LATPD00, IADD_LATPD01, IADD_LATPD10 and IADD_LATPD11, respectively.

The fifth to eighth async latches may latch the output address signal ADDR_P1 as the column select signals BYAC_BG0<0>, BYAC_BG1<0>, BYAC_BG2<0> and BYAC_BG3<0> based on the first to fourth latch control signals ADD_LATP00, ADD_LATP01, ADD_LATP10 and ADD_LATP11, and invert the column select signals BYAC_BG0<0>, BYAC_BG1<0>, BYAC_BG2<0> and BYAC_BG3<0> based on the first to fourth control signals from the first to fourth sync latches, respectively.

Hereafter, the operation of the memory device having the above-described configuration in accordance with the present embodiment will be described with reference to FIGS. 12 to 14.

Figure 12:
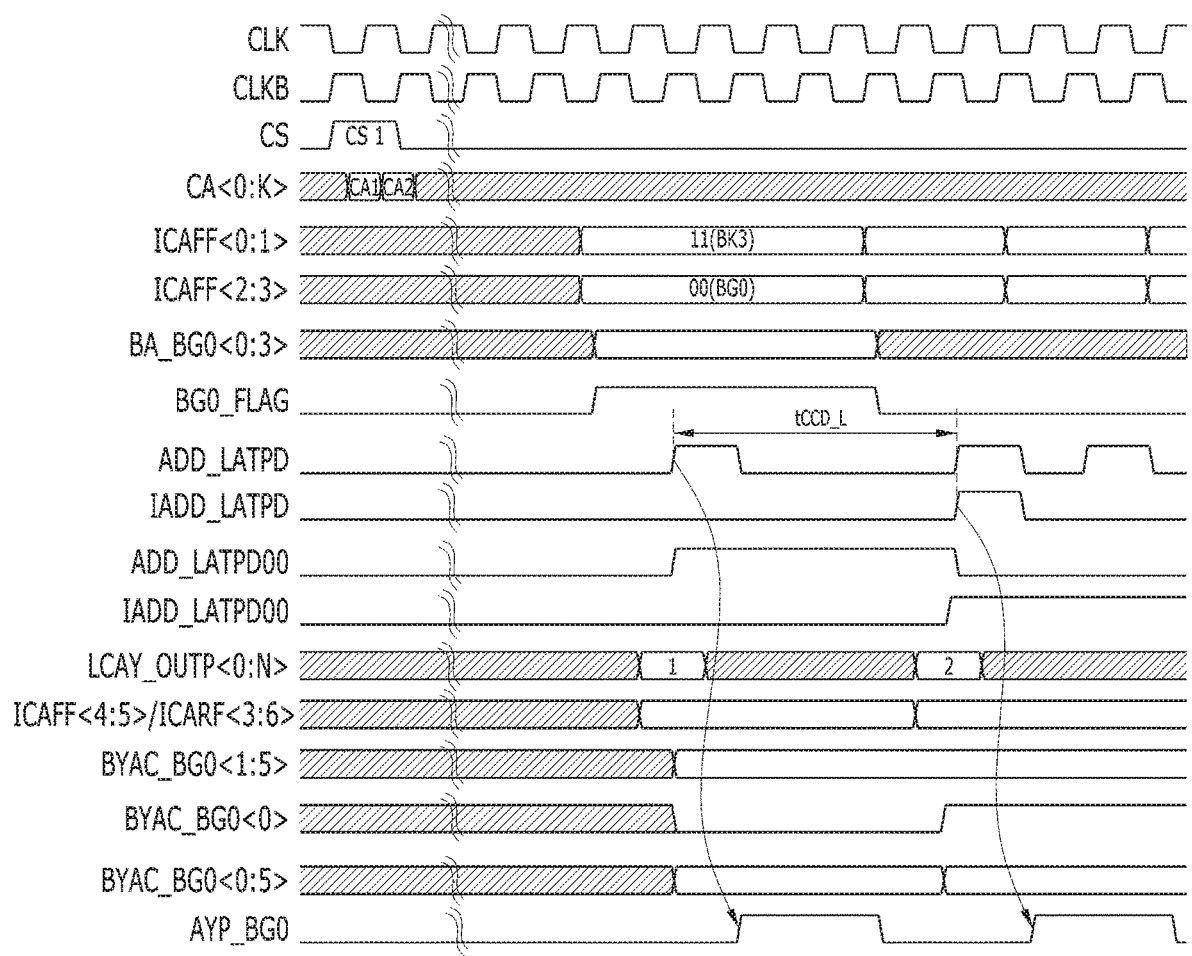
FIGS. 12 to 14 are timing diagrams illustrating an operation of a semiconductor device in accordance with an embodiment of the present invention.

FIG. 12 is a timing diagram illustrating the burst-length-32 operation based on the 4-bank-group mode.

Referring to FIG. 12, one set of first and second command signals CS and CA<0:K> corresponding to a predetermined operation mode may be inputted. The predetermined operation mode may include the write mode, the read mode and the like. The following descriptions may be based on the supposition that one set of first and second command signals CS and CA<0:K> corresponding to the write mode are inputted, but the present embodiment is not limited thereto.

As a result obtained by decoding one set of first and second command signals CS and CA<0:K>, the write command signal WR, the bank address signals ICAFF<0:3> and the column address signals ICAFF<4:5> and ICARF<3:6> may be generated. For example, the write command signal WR related to the write mode between the operation mode signals RD and WR may be activated, the bank address signals ICAFF<0:3> for selecting any one bank among the first to fourth banks BK0 to BK3 (not illustrated) included in each of the first to fourth bank groups BG0 to BG3 (not illustrated) may be generated, and the column address signals ICAFF<4:5> and ICARF<3:6> for a column access of the selected bank may be generated. The following descriptions may be based on the supposition that the bank address signals ICAFF<0:3> corresponding to the fourth bank BK3 belonging to the first bank group BG0 are generated, but the present embodiment is not limited thereto.

As the bank address signals ICAFF<0:3> are generated, the first flag signal BG0_FLAG corresponding to the first bank group BG0 may be activated for the first unit operation time tCCD_L, and the first bank select signal group BA_BG0<0:3> corresponding to the fourth bank BK3 belonging to the first bank group BG0 may be generated for the first unit operation time tCCD_L.

As the write command signal WR is generated, the latch source signal ADD_LATPD and the inverted source signal IADD_LATPD may be activated with a time interval corresponding to the first unit operation time tCCD_L.

As the latch source signal ADD_LATPD is activated, the first latch control signal ADD_LATPD00 corresponding to the first bank group BG0 among the first to fourth latch control signals ADD_LATPD00, ADD_LATPD01, ADD_LATPD10 and ADD_LATPD11 may be activated. Furthermore, as the inverted source signal IADD_LATPD is activated, the first inverted control signal IADD_LATPD00 corresponding to the first bank group BG0 among the first to fourth inverted control signals IADD_LATPD00, IADD_LATPD01, IADD_LATPD10 and IADD_LATPD11 may be activated.

Therefore, the first column select signal group BYAC_BG0<0:5> corresponding to the column address signals ICAFF<4:5> and ICARF<3:6> may be generated. At this time, the column select signal BYAC_BG0<0> of the first column select signal group BYAC_BG0<0:5> may be generated at a predetermined logic level for the first unit operation time tCCD_L, and then transition. Therefore, the first column select signal group BYAC_BG0<0:5> may be generated to access a predetermined column for the current first unit operation time tCCD_L, and generated to access another column for the next first unit operation time tCCD_L.

As the first flag signal BG0_FLAG is activated, the first data path select signal AYP_BG0 among the first to fourth data path select signals AYP_BG0, AYP_BG1, AYP_BG2 and AYP_BG3 may be activated. At this time, the first data path select signal AYP_BG0 may be activated for the second unit operation time tCCD_S in response to a point of time that the latch source signal ADD_LATPD is activated, and activated for the second unit operation time tCCD_S in response to a point of time that the inverted source signal IADD_LATPD is activated.

The above description may be summarized as follows. When one set of first and second command signals CS and CA<0:K> is inputted, 16-bit data (i.e., burst length of 16) of 32-bit data (i.e., burst length of 32) may be written to the fourth bank BK3 belonging to the first bank group BG0 for the current first unit operation time tCCD_L, and the rest 16-bit data of the 32-bit data may be written to the fourth bank BK3 belonging to the first bank group BG0 for the next first unit operation time tCCD_L, according to the first bank select signal group BA_BG0<0:3>, the first column select signal group BYAC_BG0<0:5> and the first data path select signal AYP_BG0. This may indicate that, when 32-bit data are written to the same bank group, 16-bit data may be written to the accessed bank group (for example, BG0), and the rest 16-bit data may be written to the same bank group (for example, BG0) after the first unit operation time tCCD_L.

Although not illustrated, the first and second command signals CS and CA<0:K> may be inputted at an interval of the first unit operation time tCCD_L, when the same bank group is consecutively accessed during the burst-length-32 operation based on the 4-bank-group mode. For example, the next set of first and second command signals CS and CA<0:K> corresponding to the first bank group BG0 may be inputted at the first unit operation time tCCD_L after one set of first and second command signals CS and CA<0:K> corresponding to the first bank group BG0 was inputted. During the burst-length-32 operation based on the 4-bank-group mode, however, the first and second command signals CS and CA<0:K> may be inputted at an interval of the second unit operation time tCCD_S when different bank groups are consecutively accessed. For example, the next set of first and second command signals CS and CA<0:K> corresponding to any one of the second to fourth bank groups BG1 to BG3 may be inputted at the second unit operation time tCCD_S after one set of first and second command signals CS and CA<0:K> corresponding to the first bank group BG0 was inputted.

Figure 13:
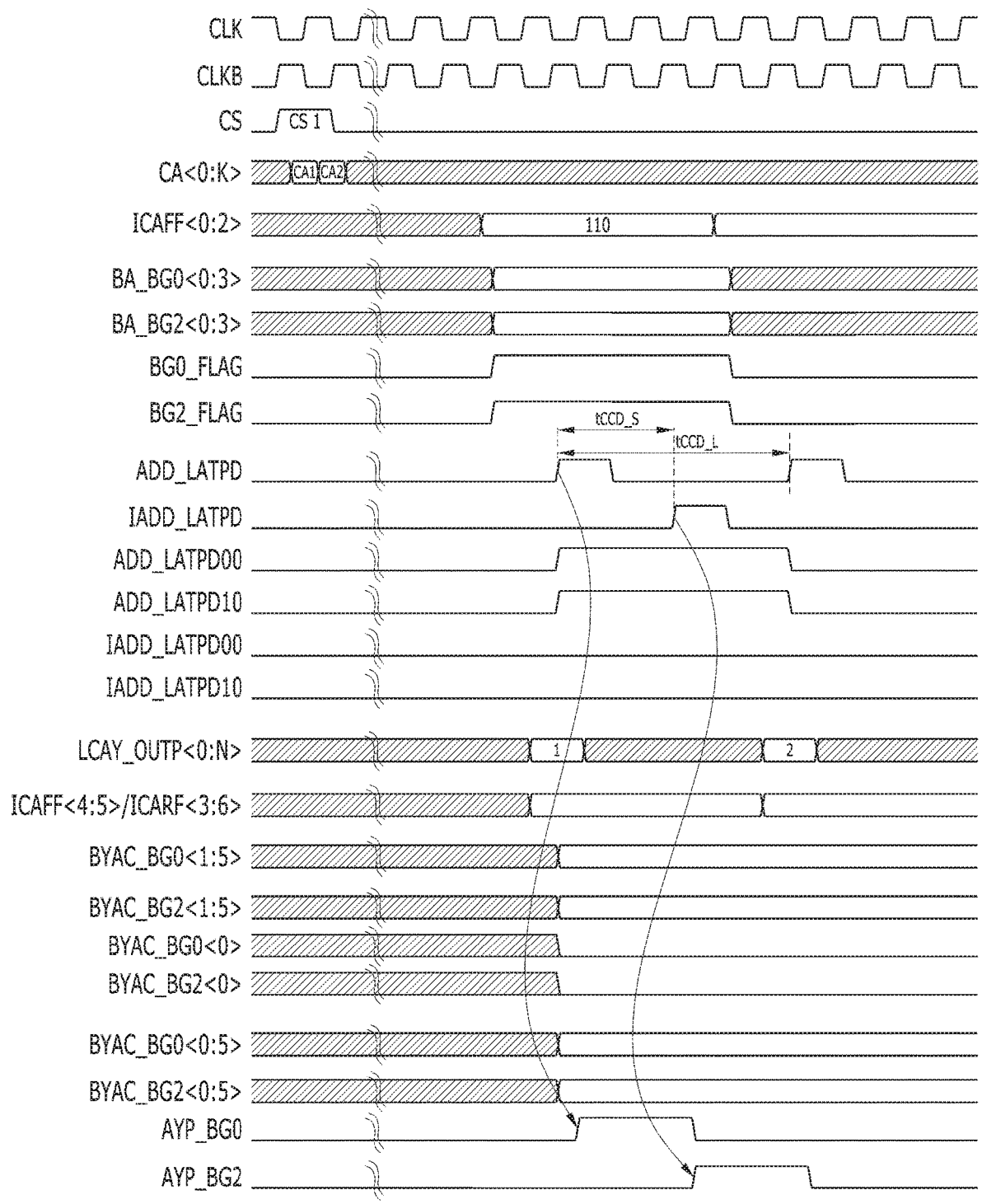

FIG. 13 is a timing diagram illustrating the burst-length-32 operation based on the 8-bank mode.

Referring to FIG. 13, one set of first and second command signals CS and CA<0:K> corresponding to a predetermined operation mode may be inputted. The predetermined operation mode may include the write mode, the read mode and the like. The following descriptions may be based on the supposition that one set of first and second command signals CS and CA<0:K> corresponding to the write mode are inputted, but the present embodiment is not limited thereto.

As a result obtained by decoding one set of first and second command signals CS and CA<0:K>, the bank address signal WR, the bank address signals ICAFF<0:3> and the column address signals ICAFF<4:5> and ICARF<3:6> may be generated. For example, the write command signal WR related to the write mode between the operation mode signals RD and WR may be activated, the bank address signals ICAFF<0:2> for selecting any two banks among the 16 banks included in the first to fourth banks BK0 to BK3 may be generated, and the column address signals ICAFF<4:5> and ICARF<3:6> for a column access of the selected bank may be generated. For reference, the 3-bit bank address signals ICAFF<0:2> are used according to the concept of selecting any one bank of eight banks. Substantially, however, all of the 4-bit bank address signals ICAFF<0:3> may be used to select any two banks of the 16 banks. The following descriptions may be based on the supposition that the bank address signals ICAFF<0:3> corresponding to any one bank belonging to the first bank group BG0 and any one bank belonging to the third bank group BG2 are generated, but the present embodiment is not limited thereto.

As the bank address signals ICAFF<0:3> are generated, the first flag signal BG0_FLAG corresponding to the first bank group BG0 and the third flag signal BG2_FLAG corresponding to the third bank group BG2 may be activated for the first unit operation time tCCD_L, and the first bank select signal group BA_BG0<0:3> corresponding to any one bank belonging to the first bank group BG0 and the third bank select signal group BA_BG2<0:3> corresponding to any one bank belonging to the third bank group BG2 may be generated for the first unit operation time tCCD_L.

As the write command signal WR is generated, the latch source signal ADD_LATPD and the inverted source signal IADD_LATPD may be activated at an interval corresponding to the second unit operation time tCCD_S.

As the latch source signal ADD_LATPD is activated, the first latch control signal ADD_LATPD00 corresponding to the first bank group BG0 and the third latch control signal ADD_LATPD02 corresponding to the third bank group BG2 among the first to fourth latch control signals ADD_LATPD00, ADD_LATPD01, ADD_LATPD10 and ADD_LATPD11 may be activated. However, although the inverted source signal IADD_LATPD is activated, the first inverted control signal IADD_LATPD00 corresponding to the first bank group BG0 and the third inverted control signal IADD_LATPD02 corresponding to the third bank group BG2 among the first to fourth inverted control signals IADD_LATPD00, IADD_LATPD01, IADD_LATPD10 and IADD_LATPD11 may be continuously deactivated.

Therefore, the first column select signal group BYAC_BG0<0:5> and the third column select signal group BYAC_BG2<0:5> corresponding to the column address signals ICAFF<4:5> and ICARF<3:6> may be generated at the same time. At this time, the column select signal BYAC_BG0<0> of the first column select signal group BYAC_BG0<0:5> and the column select signal BYAC_BG2<0> of the third column select signal group BYAC_BG2<0:5> may retain the same logic level.

As the first and third flag signals BG0_FLAG and BG3_FLAG are activated, the first and third data path select signal AYP_BG0 and AYP_BG2 among the first to fourth data path select signals AYP_BG0, AYP_BG1, AYP_BG2 and AYP_BG3 may be sequentially activated. At this time, the first data path select signal AYP_BG0 may be activated for the second unit operation time tCCD_S in response to a point of time that the latch source signal ADD_LATPD is activated, and the third data path select signal AYP_BG2 may be activated for the second unit operation time tCCD_S in response to a point of time that the inverted source signal IADD_LATPD is activated.

The above description may be summarized as follows. When one set of first and second command signals CS and CA<0:K> is inputted, 16-bit data (i.e., burst length of 16) of 32-bit data (i.e., burst length of 32) may be written to any one bank belonging to the first bank group BG0 for the leading second unit operation time tCCD_S of the first unit operation time tCCD_L, and the rest 16-bit data of the 32-bit data may be written to any one bank belonging to the third bank group BG2 for the following second unit operation time tCCD_S of the first unit operation time tCCD_L, according to the first bank select signal group BA_BG0<0:3>, the first column select signal group BYAC_BG0<0:5> and the first data path select signal AYP_BG0.

Figure 14:
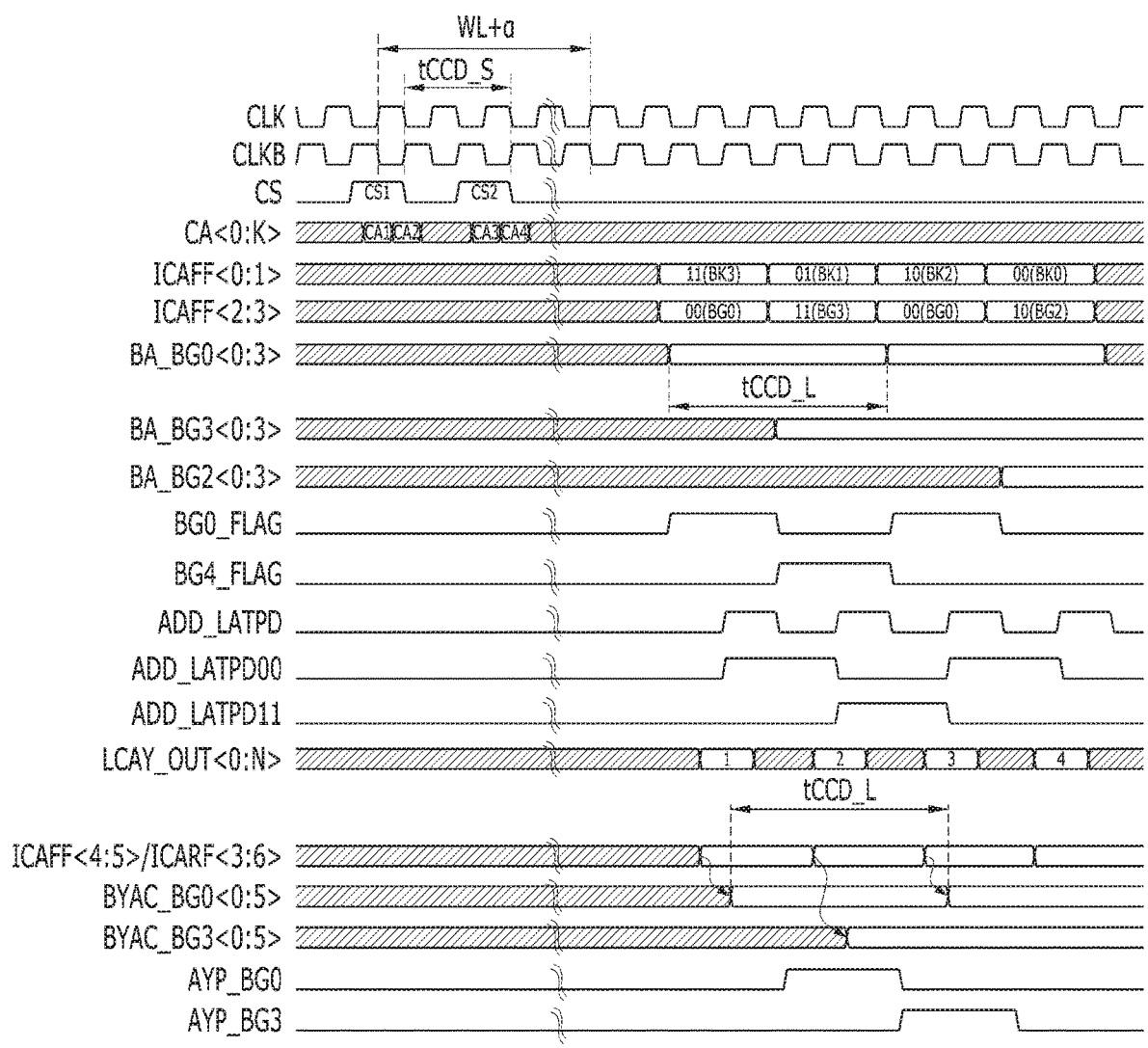

FIG. 14 is a timing diagram illustrating the burst-length-16 operation based on the 4-bank-group mode.

Referring to FIG. 14, multiple sets of first and second command signals CS and CA<0:K> corresponding to a predetermined operation mode may be consecutively inputted at an interval of the second unit operation time tCCD_S, during the burst-length-16 operation based on the 4-bank-group mode. The predetermined operation mode may include the write mode, the read mode and the like. The following descriptions may be based on the supposition that the first and second command signals CS and CA<0:K> corresponding to the write mode are consecutively inputted, but the present embodiment is not limited thereto.

As results obtained by decoding the respective sets of first and second command signals CS and CA<0:K>, the write command signal WR, the bank address signals ICAFF<0:3> and the column address signals ICAFF<4:5> and ICARF<3:6> may be generated. For example, the write command signal WR related to the write mode between the operation mode signals RD and WR may be activated, the bank address signals ICAFF<0:3> for selecting any one bank of the first to fourth bank groups BG0 to BG3 each including the first to fourth banks BK0 to BK3 may be generated, and the column address signals ICAFF<4:5> and ICARF<3:6> for a column access of the selected bank may be generated. The following descriptions may be based on the supposition that the bank address signals ICAFF<0:3> corresponding to the fourth bank BK3 belonging to the first bank group BG0 are generated according to a first set of first and second command signals CS and CA<0:K>, and the bank address signals ICAFF<0:3> corresponding to the second bank BK1 belonging to the fourth bank group BG3 are then generated according to the next set of first and second command signals CS and CA<0:K>, but the present embodiment is not limited thereto.

As the bank address signals ICAFF<0:3> corresponding to the fourth bank BK3 belonging to the first bank group BG0 are generated, the first flag signal BG0_FLAG corresponding to the first bank group BG0 may be activated for the second unit operation time tCCD_S, and the first bank select signal group BA_BG0<0:3> corresponding to the fourth bank BK3 belonging to the first bank group BG0 may be generated for at least the first unit operation time tCCD_L. The first bank select signal group BA_BG0<0:3> may be latched according to the first flag signal BG0_FLAG, and updated whenever the first flag signal BG0_FLAG is activated.

As the bank address signals ICAFF<0:3> corresponding to the second bank BK1 belonging to the fourth bank group BG3 are generated, the fourth flag signal BG3_FLAG corresponding to the fourth bank group BG3 may be activated for the second unit operation time tCCD_S, and the fourth bank select signal group BA_BG3<0:3> corresponding to the second bank BK1 belonging to the fourth bank group BG3 may be generated for at least the first unit operation time tCCD_L. The fourth bank select signal group BA_BG3<0:3> may be latched according to the fourth flag signal BG3_FLAG, and updated whenever the fourth flag signal BG3_FLAG is activated.

As the write command signal WR is generated multiple times at an interval of the second unit operation time tCCD_S, the latch source signal ADD_LATPD may be activated in a cycle corresponding to the second unit operation time tCCD_S, and the inverted source signal IADD_LATPD may be continuously activated.

As the latch source signal ADD_LATPD is activated in a cycle corresponding to the second unit operation time tCCD_S, the first latch control signal ADD_LATPD00 corresponding to the first bank group BG0 and the fourth latch control signal ADD_LATPD11 corresponding to the fourth bank group BG3 among the first to fourth latch control signals ADD_LATPD00, ADD_LATPD01, ADD_LATPD10 and ADD_LATPD11 may be activated. Each of the first and fourth latch control signals ADD_LATPD00 and ADD_LATPD11 may be activated for the second unit operation time tCCD_S.

Therefore, the first column select signal group BYAC_BG0<0:5> and the fourth column select signal group BYAC_BG3<0:5> may be sequentially generated according to the column address signals ICAFF<4:5> and ICARF<3:6>. At this time, each of the first and fourth column select signal groups BYAC_BG0<0:5> and BYAC_BG3<0:5> may be generated for at least the first unit operation time tCCD_L.

As the first flag signal BG0_FLAG is activated, the first data path select signal AYP_BG0 among the first to fourth data path select signals AYP_BG0, AYP_BG1, AYP_BG2 and AYP_BG3 may be activated. At this time, the first data path select signal AYP_BG0 may be activated for the second unit operation time tCCD_S in response to a point of time that the latch source signal ADD_LATPD is activated for the first time, and the fourth data path select signal AYP_BG3 may be activated for the second unit operation time tCCD_S in response to a point of time that the latch source signal ADD_LATPD is activated for the second time.

The operation of the burst-length-16 operation based on the 4-bank-group mode may be summarized as follows. When two sets of first and second command signals CS and CA<0:K> are inputted at an interval of the second unit operation time tCCD_S, 16-bit data (i.e., burst length of 16) may be written to the fourth bank BK4 belonging to the first bank group BG0 for the second unit operation time tCCD_S, according to the first bank select signal group BA_BG0<0:3>, the first column select signal group BYAC_BG0<0:5> and the first data path select signal AYP_BG0, and 16-bit data (i.e., burst length of 16) may be written to the second bank BK1 belonging to the fourth bank group BG3 for the second unit operation time tCCD_S, according to the fourth bank select signal group BA_BG3<0:3>, the fourth column select signal group BYAC_BG3<0:5> and the fourth data path select signal AYP_BG3. At this time, although the command signals CS and CA<0:K> are consecutively inputted at an interval of the second unit operation time tCCD_S, the first bank select signal group BA_BG0<0:3>, the first column select signal group BYAC_BG0<0:5>, the fourth bank select signal group BA_BG3<0:3> and the fourth column select signal group BYAC_BG3<0:5> may be generated for at least the first unit operation time tCCD_L, which makes it possible to secure an operation margin.

In accordance with the present embodiment, the semiconductor device can perform the 4-bank-group mode and the 8-bank mode in a compatible manner at the same time, and secure an operation margin for the internal control signals during the burst-length-16 operation based on the 4-bank-group mode.

The semiconductor device can flexibly control different data input/output methods for the respective modes through one circuit, thereby exhibiting the optimized performance in terms of the area and power consumption.

Furthermore, the semiconductor device can secure an operation margin for internal signals during a specific mode, thereby guaranteeing a stable operation while reducing a voltage variation.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprising:
a memory region selection circuit suitable for generating a plurality of memory region select signals based on a memory region address signal and a mode identification signal, and activating one or more memory region select signals among the plurality of memory region select signals during a first mode, or activating two or more memory region select signals among the plurality of memory region select signals during a second mode;
a column selection circuit suitable for generating a plurality of column select signals based on a column address signal and the mode identification signal, and changing the plurality of column select signals during the first mode, or retaining the plurality of column select signals during the second mode; and
a plurality of memory regions of which one or more memory regions are accessed during the first mode or two or more memory regions are accessed during the second mode, based on the plurality of memory region select signals and the plurality of column select signals,
wherein the column selection circuit generates and retains the plurality of column select signals for a current unit operation time, and changes and retains the plurality of column select signals for a next unit operation time, per input of the column address signal during the first mode, and
wherein the column select circuit generates and retains the plurality of column select signals for the current unit operation time per input of the column address signal during the second mode.

2. The semiconductor device of claim 1, wherein the memory region selection circuit activates the one or more memory region select signals for a unit operation time during the first mode, and
wherein the memory region selection circuit activates the two or more memory region select signals for the unit operation time during the second mode.

3. The semiconductor device of claim 2, wherein the unit operation time comprises a minimum time required for consecutively accessing the same memory region among the plurality of memory regions.

4. The semiconductor device of claim 1, wherein the current unit operation time and the next unit operation time respectively comprise a minimum time required for consecutively accessing the same memory region among the plurality of memory regions.

5. The semiconductor device of claim 1, wherein the plurality of memory regions comprises 16 banks,
the first mode comprises a 4-bank-group mode, and
the second mode comprises an 8-bank mode.

6. A semiconductor device comprising:
a plurality of memory regions;
a data path selection circuit suitable for generating a plurality of data path select signals for selectively coupling the plurality of memory regions to a data path, based on an operation mode signal, a mode identification signal and a plurality of flag signals, wherein the data path selection circuit activates a data path select signal corresponding to one memory region to be accessed among the plurality of data path select signals for a current second unit operation time of a current first unit operation time and activates the data path select signal for a next second unit operation time of a next first unit operation time, during a first mode, or sequentially activates data path select signals corresponding to two memory regions to be accessed among the plurality of data path select signals for the current first unit operation time during a second mode;
a memory region selection circuit suitable for generating a plurality of memory region select signals corresponding to the plurality of memory regions based on the operation mode signal, the mode identification signal, memory region address signals and a latch source signal, wherein the memory region selection circuit activates a memory region select signal corresponding to the one memory region to be accessed among the plurality of memory region select signals for the current first unit operation time during the first mode, or activates memory region select signals corresponding to the two memory regions to be accessed among the plurality of memory region select signals at the same time for the current second unit operation time during the second mode; and
a column selection circuit suitable for generating a plurality of column select signals based on the mode identification signal, column address signals, an inverted source signal and a plurality of latch control signals, wherein the column selection circuit generates and retains a column select signal group corresponding to the one memory region to be accessed among the plurality of column select signals for the current first unit operation time and changes and retains the column select signal group for the next first unit operation time, per input of the column address signals during the first mode, or generates and retains column select signal groups corresponding to the two memory regions to be accessed among the plurality of column select signals at the same time for the current first unit operation time per input of the column address signals during the second mode.

7. The semiconductor device of claim 6, wherein the current first unit operation time and the next first unit operation time respectively comprise a minimum time required for consecutively accessing the same memory region among the plurality of memory regions, and
the current second unit operation time and the next second unit operation time respectively comprise a minimum time required for consecutively accessing different memory regions among the plurality of memory regions.

8. The semiconductor device of claim 6, wherein the data path selection circuit comprises:
a first data path selection unit suitable for generating first and second operation control signals based on the operation mode signal and the mode identification signal, and activating the first operation control signal and then activating the second operation control signal after the current first unit operation time, during the first mode, or activating the first operation control signal and then activating the second operation control signal after the current second unit operation time, during the second mode;
a second data path selection unit suitable for generating the latch source signal and the inverted source signal based on the mode identification signal and the first and second operation control signals, and activating the latch source signal according to the first operation control signal and then activating the inverted source signal according to the second operation control signal after the current first unit operation time, during the first mode, or activating the latch source signal according to the first operation control signal and continuously deactivating the inverted source signal regardless of the second operation control signal, during the second mode; and
a third data path selection unit suitable for generating the plurality of data path select signals based on the first and second operation control signals and the plurality of flag signals.

9. The semiconductor device of claim 6, wherein the memory region selection circuit comprises:
a first selection unit suitable for generating a plurality of first select code signals and a plurality of second select code signal, based on the operation mode signal and the memory region address signals;
a second selection unit suitable for generating the plurality of flag signals based on the plurality of first select code signals and the mode identification signal;
a third selection unit suitable for generating the plurality of memory region select signals based on the plurality of second select code signals and the plurality of flag signals; and
a fourth selection unit suitable for generating the plurality of latch control signals based on the plurality of flag signals and the latch source signal.

10. The semiconductor device of claim 6, wherein the column selection circuit comprises:
a first generation unit suitable for generating some column select signals of the plurality of column select signals based on some column address signals of the column address signals and the plurality of latch control signals, wherein the first generation unit generates and retains column select signals corresponding to the one memory region to be accessed among the some column select signals for the current first unit operation time and the next first unit operation time during the first mode, or generates and retains column select signals corresponding to the two memory regions to be accessed among the some column select signals for the current first unit operation time during the second mode; and
a second generation unit suitable for generating the other column select signals of the plurality of column select signals based on the other column address signals of the column address signals, the mode identification signal, the plurality of latch control signals and the inverted source signal, wherein the second generation unit generates and retains a column select signal corresponding to the one memory region to be accessed among the other column select signals for the current first unit operation time, and changes and retains the column select signal for the next unit operation time, during the first mode, or generates and retains column select signals corresponding to the two memory regions to be accessed among the other column select signals for the current first unit operation time during the second mode.

11. The semiconductor device of claim 6, wherein the plurality of memory regions comprises 16 banks,
the first mode comprises a 4-bank-group mode, and
the second mode comprises an 8-bank mode.

12. The semiconductor device of claim 6, wherein the data path selection circuit activates the data path select signal for the current second unit operation time of the current first unit operation time and activates the data path select signal for the next second unit operation time of the next first unit operation time, per input of the column address signals during a first burst operation based on the first mode, or activates the data path select signal for the current second unit operation time per input of the column address signals during a second burst operation based on the first mode, based on a burst length information signal, and
wherein, during the second burst operation, the column address signals are consecutively inputted at an interval of a second unit operation time.

13. The semiconductor device of claim 12, wherein the memory region selection circuit activates the memory region select signal for the current first unit operation time per input of the column address signals during the first and second operations based on the first mode.

14. The semiconductor device of claim 12, wherein the column selection circuit generates and retains the column select signal group for the current first unit operation time, and changes and retains the column select signal group for the next first unit operation time, per input of the column address signals during the first burst operation based on the first mode, or generates and retains the column select signal group for the current first unit operation time per input of the column address signals during the second burst operation based on the first mode.

15. A semiconductor device comprising:
a plurality of memory regions;
a data path selection circuit suitable for generating a plurality of data path select signals for selectively coupling the plurality of memory regions to a data path, based on an operation mode signal, a burst length information signal and a plurality of flag signals, wherein the data path selection circuit activates a data path select signal corresponding to one memory region to be accessed among the plurality of data path select signals for a current second unit operation time of a current first unit operation time and activates the data path select signal for the next second unit operation time of the next first unit operation time, per input of column address signals during a first burst operation, or activates the data path select signal among the plurality of data path select signals for the current second unit operation time per input of the column address signals during a second burst operation;
a memory region selection circuit suitable for generating a plurality of memory region select signals corresponding to the plurality of memory regions based on the operation mode signal, the mode identification signal, memory region address signals and a latch source signal, wherein the memory region selection circuit activates a memory region select signal corresponding to the one memory region to be accessed among the plurality of memory region select signals for the current first unit operation time per input of the column address signals during the first and second burst operations; and a column selection circuit suitable for generating a plurality of column select signals based on the mode identification signal, the column address signals, an inverted source signal and a plurality of latch control signals, wherein the column selection circuit generates and retains a column select signal group corresponding to the one memory region to be accessed among the plurality of column select signals for the current first unit operation time, and changes and retains the column select signal group for the next first unit operation time, per input of the column address signals during the first burst operation, or generates and retains the column select signal group for the current first unit operation time per input of the column address signals during the second burst operation.

16. The semiconductor device of claim 15, wherein during the first burst operation, the column address signals are consecutively inputted at an interval of a first unit operation time or a second unit operation time, and during the second burst operation, the column address signals are consecutively inputted at an interval of a second unit operation time.

17. The semiconductor device of claim 15, wherein the current first unit operation time and the next current first unit operation time respectively comprise a minimum time required for consecutively accessing the same memory region among the plurality of memory regions, and the current second unit operation time and the next second unit operation time respectively comprise a minimum time required for consecutively accessing different memory regions among the plurality of memory regions.

* * * * *